(12) United States Patent
Chung et al.

(10) Patent No.: US 11,864,411 B2
(45) Date of Patent: Jan. 2, 2024

(54) DISPLAY APPARATUS AND METHOD OF MANUFACTURING THE SAME

(71) Applicant: SAMSUNG DISPLAY CO., LTD., Yongin-si (KR)

(72) Inventors: Yungbin Chung, Yongin-si (KR); Sanggun Choi, Yongin-si (KR); Yeoungkeol Woo, Yongin-si (KR); Myounggeun Cha, Yongin-si (KR); Eunjin Kwak, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 100 days.

(21) Appl. No.: 17/092,568

(22) Filed: Nov. 9, 2020

(65) Prior Publication Data

US 2021/0320278 A1  Oct. 14, 2021

(30) Foreign Application Priority Data

Apr. 9, 2020  (KR) .................. 10-2020-0043604

(51) Int. Cl.
*H10K 50/844*  (2023.01)
*H01L 29/786*  (2006.01)
*H10K 71/00*  (2023.01)

(52) U.S. Cl.
CPC ......... *H10K 50/844* (2023.02); *H01L 29/786* (2013.01); *H10K 71/00* (2023.02)

(58) Field of Classification Search
CPC ....... H01L 51/5253–5256; H01L 51/56; H01L 29/786; H10K 50/844; H10K 71/00; H10K 29/786
See application file for complete search history.

(56) References Cited

U.S. PATENT DOCUMENTS

| | | | |
|---|---|---|---|
| 8,496,753 B2 | 7/2013 | Jauhiainen et al. | |
| 8,981,359 B2 | 3/2015 | Kum et al. | |
| 9,013,018 B2 | 4/2015 | Pankow et al. | |
| 9,443,915 B2 | 9/2016 | Kim et al. | |
| 2006/0275540 A1* | 12/2006 | Kubota | H01L 51/5256 445/25 |

(Continued)

FOREIGN PATENT DOCUMENTS

| | | |
|---|---|---|
| KR | 10-1089715 | 11/2011 |
| KR | 10-2016-0032343 | 3/2016 |

(Continued)

*Primary Examiner* — Shaun M Campbell
(74) *Attorney, Agent, or Firm* — F. CHAU & ASSOCIATES, LLC

(57) ABSTRACT

A display apparatus includes a first substrate, a main pixel circuit located on the first substrate and including a first semiconductor layer, an auxiliary pixel circuit located on the first substrate and including a second semiconductor layer, a buffer layer located between the first substrate and the first semiconductor layer and between the first substrate and the second semiconductor layer, and a barrier layer located between the first substrate and the buffer layer, including one material from among silicon nitride ($SiN_x$), aluminum oxide ($Al_2O_3$), and zirconium oxide ($Zr_2O_3$), and having a density ranging from about 2 $g/cm^3$ to about 6 $g/cm^3$.

19 Claims, 15 Drawing Sheets

(56) References Cited

U.S. PATENT DOCUMENTS

| | | | |
|---|---|---|---|
| 2011/0100458 A1 | 5/2011 | Kang et al. | |
| 2013/0341629 A1* | 12/2013 | Seo | H01L 29/786 |
| | | | 438/34 |
| 2014/0339527 A1* | 11/2014 | Lee | H01L 27/32 |
| | | | 438/34 |
| 2016/0141551 A1* | 5/2016 | Seo | H01L 51/0097 |
| | | | 257/40 |
| 2016/0164031 A1* | 6/2016 | Pieper | C09J 5/00 |
| | | | 438/26 |
| 2017/0338433 A1* | 11/2017 | Ishii | G02F 1/136 |
| 2018/0089485 A1* | 3/2018 | Bok | G06F 3/0412 |
| 2020/0006706 A1* | 1/2020 | Washio | H01L 51/0097 |
| 2020/0052002 A1* | 2/2020 | Kwak | H01L 27/1262 |
| 2020/0052051 A1* | 2/2020 | Lee | H10K 59/124 |
| 2020/0058725 A1* | 2/2020 | Ka | H10K 50/844 |
| 2020/0203445 A1* | 6/2020 | Ou | H01L 27/3218 |
| 2021/0202621 A1* | 7/2021 | Liang | H01L 27/3262 |
| 2021/0408148 A1* | 12/2021 | Wang | H01L 27/3234 |

FOREIGN PATENT DOCUMENTS

| | | |
|---|---|---|
| KR | 10-2019-0060260 | 6/2019 |
| KR | 10-2047745 | 11/2019 |
| KR | 10-2050447 | 11/2019 |

\* cited by examiner

DISPLAY APPARATUS AND METHOD OF MANUFACTURING THE SAME

CROSS-REFERENCE TO RELATED APPLICATION

This application claims the benefit under 35 U.S.C. § 119 of Korean Patent Application No. 10-2020-0043604, filed on Apr. 9, 2020, in the Korean Intellectual Property Office, the disclosure of which is incorporated by reference herein in its entirety.

TECHNICAL FIELD

Exemplary embodiments of the present disclosure relate to a display apparatus and a method of manufacturing the same, and more particularly, to a display apparatus with enhanced product reliability and a method of manufacturing the same.

DISCUSSION OF RELATED ART

Recently, display apparatuses have been used for various purposes. Also, as the thickness and weight of the display apparatuses have been reduced, their range of applications has been greatly widened.

As the display apparatuses have been widely used, various methods of designing the shapes of the display apparatuses have been used and the number of functions linked to or associated with the display apparatuses has increased. In the process of forming a display apparatus having multiple functions, a semiconductor layer of the display apparatus may be formed by a laser crystallization process that crystallizes amorphous silicon into polysilicon. However, during the laser crystallization process, the uniformity of the crystallized polysilicon may be reduced due to the diffusion of unwanted species or contaminants from the substrate into the semiconductor layer. Therefore, it is desirable to provide a display apparatus having a proper shape so that a laser crystallization process can be stably performed.

SUMMARY

Exemplary embodiments of the present disclosure provide a display apparatus having an extended display area so that an image is displayed even in an area where a component such as an electronic element is located, and a method of manufacturing the display apparatus.

Additional aspects will be set forth in part in the description which follows and, in part, will be apparent from the description, or may be learned by practice of the presented exemplary embodiments of the present disclosure.

According to an exemplary embodiment of the present disclosure, a display apparatus including a main display area, a component area including a transmission area, and a peripheral area located outside the main display area further includes a first substrate, a main pixel circuit located on the first substrate to correspond to the main display area, and including a main display element and a first semiconductor layer connected to the main display element, an auxiliary pixel circuit located on the first substrate to correspond to the component area, and including an auxiliary display element and a second semiconductor layer connected to the auxiliary display element, a buffer layer located between the first substrate and the first semiconductor layer and between the first substrate and the second semiconductor layer, and a barrier layer located between the first substrate and the buffer layer, including one material from among silicon nitride ($SiN_x$), aluminum oxide ($Al_2O_3$), and zirconium oxide ($Zr_2O_3$), and having a density ranging from about 2 $g/cm^3$ to about 6 $g/cm^3$.

The barrier layer may be directly located on the first substrate.

The barrier layer may have a thickness ranging from about 200 Å to about 600 Å from a top surface of the first substrate.

The auxiliary display element may include a counter electrode, in which the counter electrode has a transmission hole corresponding to the transmission area.

The buffer layer may include a first buffer layer and a second buffer layer, in which the barrier layer is located between the first buffer layer and the second buffer layer.

The barrier layer may have a thickness ranging from about 200 Å to about 600 Å from a top surface of the first buffer layer.

The barrier layer may include a first barrier layer and a second barrier layer, and the buffer layer may include a first buffer layer and a second buffer layer.

The first barrier layer may be directly located on the first substrate, the first buffer layer may be directly located on the first barrier layer, the second barrier layer may be directly located on the first buffer layer, and the second buffer layer may be directly located on the second barrier layer.

The display apparatus may further include a second substrate located under the first substrate, in which a thickness of the second substrate is greater than a thickness of the first substrate.

The display apparatus may further include a first inorganic layer located between the first substrate and the second substrate, and a second inorganic layer directly located on the first inorganic layer.

The barrier layer may have a thickness ranging from about 200 Å to about 600 Å, and may be directly located on the first substrate.

The buffer layer may include a first buffer layer and a second buffer layer, and the barrier layer may be located between the first buffer layer and the second buffer layer.

The barrier layer may include a first barrier layer and a second barrier layer, the buffer layer may include a first buffer layer and a second buffer layer, the first barrier layer may be directly located on the first substrate, the first buffer layer may be directly located on the first barrier layer, the second barrier layer may be directly located on the first buffer layer, and the second buffer layer may be directly located on the second barrier layer.

The display apparatus may further include a bottom metal layer located between the first substrate and the auxiliary pixel circuit in the component area, in which the bottom metal layer has a bottom hole corresponding to the transmission area.

According to an exemplary embodiment of the present disclosure, a method of manufacturing a display apparatus including a main display area, a component area including a transmission area, and a peripheral area located outside the main display area includes preparing a first substrate, forming a barrier layer having a density ranging from about 2 $g/cm^3$ to about 6 $g/cm^3$ on the first substrate, forming a buffer layer on the barrier layer, and forming a main pixel circuit including a first semiconductor layer located on the buffer layer to correspond to the main display area and an auxiliary pixel circuit including a second semiconductor layer located on the buffer layer to correspond to the component area.

In the forming of the barrier layer having the density ranging from about 2 g/cm³ to about 6 g/cm³ on the first substrate, the barrier layer may include silicon nitride ($SiN_x$) formed by a plasma-enhanced chemical vapor deposition (PECVD) process using at least one gas selected from among ammonia ($NH_3$), nitrogen ($N_2$), and silane ($SiH_4$).

In the forming of the barrier layer having the density ranging from about 2 g/cm³ to about 6 g/cm³ on the first substrate, the barrier layer may include silicon nitride ($Si_3N_4$) formed by a reaction between ammonia ($NH_3$) and silane ($SiH_4$) at a temperature of 1000° C. or higher.

In the forming of the barrier layer having the density ranging from about 2 g/cm³ to about 6 g/cm³ on the first substrate, the barrier layer may include one material from among aluminum oxide ($Al_2O_3$) and zirconium oxide ($Zr_2O_3$) formed by an atomic layer deposition (ALD) process.

The barrier layer may have a thickness ranging from about 200 Å to about 600 Å, and may be directly formed on the first substrate.

The method may further include, before the preparing of the first substrate, preparing a second substrate, forming a first inorganic layer on the second substrate, and forming a second inorganic layer on the first inorganic layer, in which the first substrate is formed on the second inorganic layer.

According to an exemplary embodiment of the present disclosure, a display apparatus includes a substrate, the substrate including a main display area, a component area including a transmission area and at least partially surrounded by the main display area, and a peripheral area located outside the main display area, a barrier layer having a density ranging from about 2 g/cm³ to about 6 g/cm³ formed on the substrate, a buffer layer formed on the barrier layer, a main pixel circuit including a first semiconductor layer formed on the buffer layer to correspond to the main display area, and an auxiliary pixel circuit including a second semiconductor layer formed on the buffer layer to correspond to the component area.

The barrier layer has a thickness ranging from about 200 Å to about 600 Å from a top surface of the substrate, and includes one material from among silicon nitride ($SiN_x$), aluminum oxide ($Al_2O_3$), and zirconium oxide ($Zr_2O_3$)

Other aspects and features of the present disclosure will become more apparent from the drawings, the claims, and the detailed description.

BRIEF DESCRIPTION OF THE DRAWINGS

The above and other aspects and features of the present disclosure will be more apparent from the following description of the exemplary embodiments taken in conjunction with the accompanying drawings, in which.

Figure 1:
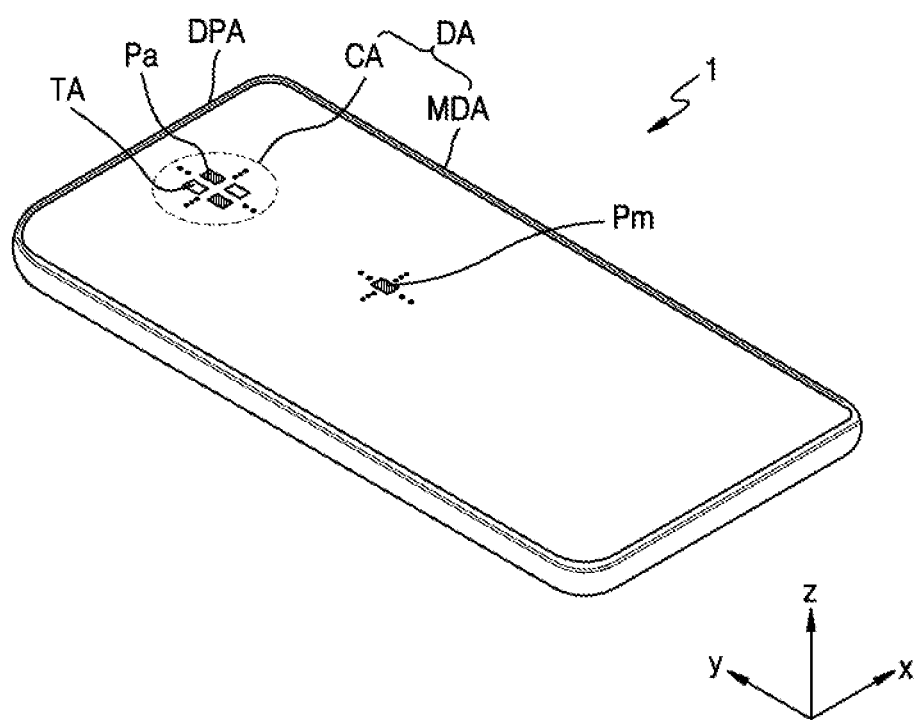
FIG. 1 is a perspective view illustrating a display apparatus according to an exemplary embodiment of the present disclosure.

Since the drawings in FIGS. 1-15 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Reference will now be made in detail to exemplary embodiments of the present disclosure, examples of which are illustrated in the accompanying drawings, in which like reference numerals refer to like elements throughout. In this regard, the exemplary embodiments may have different forms and should not be construed as being limited to the descriptions set forth herein. Accordingly, the exemplary embodiments are merely described below, by referring to the figures, to explain aspects of the present disclosure. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous exemplary embodiments, specific exemplary embodiments will be illustrated in the drawings and described in detail in the written description. The effects and features of the present disclosure and the accompanying methods thereof will become apparent from the following description of the exemplary embodiments, taken in conjunction with the accompanying drawings. However, the present disclosure is not limited to the specific exemplary embodiments described below, and may be embodied in various modes.

Although the terms "first", "second", etc. may be used to describe various elements, these elements should not be limited by these terms. These terms are only used to distinguish one element from another.

As used herein, the singular forms "a", "an", and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or element is referred to as being "on" another layer, region, or element, it may be directly on the other layer, region, or element or may be indirectly on the other layer, region, or element with intervening layers, regions, or elements interposed therebetween.

"A and/or B" is used herein to select only A, select only B, or select both A and B. "At least one of A and B" is used herein to select only A, select only B, or select both A and B.

In the following exemplary embodiments, when a wiring "extends in a first direction or a second direction", it may mean that the wiring extends not only in a linear shape but also in a zigzag or curved shape in the first direction or the second direction.

In the following exemplary embodiments, "a plan view of an object" refers to a view of an object seen from above, and "a cross-sectional view of an object" refers to a view of an object vertically cut and seen from the side. In the following exemplary embodiments, when elements "overlap", it may mean that the elements overlap in a "plan view" and/or a "cross-sectional view".

The term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The present disclosure will now be described more fully with reference to the accompanying drawings, in which exemplary embodiments of the present disclosure are shown, and in each drawing, the same or corresponding element is denoted by the same reference numeral.

FIG. 1 is a perspective view illustrating a display apparatus according to an exemplary embodiment of the present disclosure.

Referring to FIG. 1, a display apparatus 1 includes a display area DA and a peripheral area DPA outside the display area DA. The display area DA includes a component area CA, and a main display area MDA at least partially surrounding the component area CA. For example, the component area CA may be entirely surrounded by the main display area MDA. For example, the component area CA and the main display area MDA may display an image individually or together. The peripheral area DPA may be a non-display area where display elements are not located. The display area DA may be entirely surrounded by the peripheral area DPA. The display apparatus 1 may include a flat display surface, however, the present disclosure is not limited thereto. For example, the display apparatus 1 may include a curved display surface or a three-dimensional display surface. The three-dimensional display surface, in which images are generated within a display volume rather than upon a stationary surface, may include a plurality of display areas, for example, a polyprism surface. The plurality of display areas may be oriented in different directions.

In FIG. 1, one component area CA is located in the main display area MDA. In an exemplary embodiment of the present disclosure, the display apparatus 1 may include two or more component areas CA, and shapes and sizes of the plurality of component areas CA may be different from one another, or may be the same as each other. When viewed in a direction substantially perpendicular to a top surface of the display apparatus 1, the component area CA may have any of various shapes such as, for example, a circular shape, an elliptical shape, a polygonal shape (e.g., a quadrangular shape), a star shape, or a diamond shape. Although the component area CA is located at the center of an upper portion (in a +Y-direction) of the main display area MDA having a substantially quadrangular shape when viewed in a direction substantially perpendicular to the top surface of the display apparatus 1 in FIG. 1, the present disclosure is not limited thereto. For example, the component area CA may be located on a side portion, for example, an upper right portion or an upper left portion, of the main display area MDA having the substantially quadrangular shape.

The display apparatus 1 may provide an image by using a plurality of main sub-pixels Pm located in the main display area MDA and a plurality of auxiliary sub-pixels Pa located in the component area CA. In an exemplary embodiment of the present disclosure, the plurality of main sub-pixels Pm and/or the plurality of auxiliary sub-pixels Pa may be arranged in a pantile matrix shape, but the present disclosure is not limited thereto.

In the component area CA, a component 40 that is an electronic element may be located under a first substrate 100 to correspond to the component area CA, as described below with reference to FIG. 2. The component 40 that is a camera using infrared or visible light may include an imaging device. For example, when the component 40 is an electronic element using light, the component 40 may use light of various wavelength bands such as visible light, infrared light, or ultraviolet light. Alternatively, the component 40 may be a solar cell, a speaker, a flash light, an illuminance sensor, a proximity sensor, a thermal detection sensor, or an iris sensor. The component 40 may detect an external object received through the component area CA or provide a sound signal such as voice to the outside through the component area CA. Alternatively, the component 40 may have a function of receiving sound. To minimize the functional limitation of the component 40, the component area CA may include a transmission area TA through which light and/or sound output from the component 40 to the outside or traveling from the outside toward the component 40 may be transmitted. In the display apparatus 1 according to an exemplary embodiment of the present disclosure, when light is transmitted through the component area CA, a light transmittance may be equal to or greater than about 10%, for example, equal to or greater than 40%, 25%, 50%, 85%, or 90%. When the light is infrared light, the component area CA of the component 40 (e.g., an infrared sensor) may not have high transmittance in visible light.

A plurality of auxiliary sub-pixels Pa may be located in the component area CA. The plurality of auxiliary sub-pixels PA may emit light to provide a certain image. Each of the plurality of auxiliary sub-pixels PA may emit, for example, red, green, blue, or white light. An image displayed by the component area CA may be an auxiliary image and may have a resolution less than that of an image displayed by the main display area MDA. That is, when the component area CA includes the transmission area TA through which light and/or sound may be transmitted and no sub-pixel is located in the transmission area TA, the number of auxiliary sub-pixels Pa that may be located per unit area may be less than the number of main sub-pixels Pm located per unit area in the main display area MDA. For example, the number of auxiliary sub-pixels Pa in the component area CA may be reduced due to no sub-pixel is located in the transmission area TA.

Figure 2:
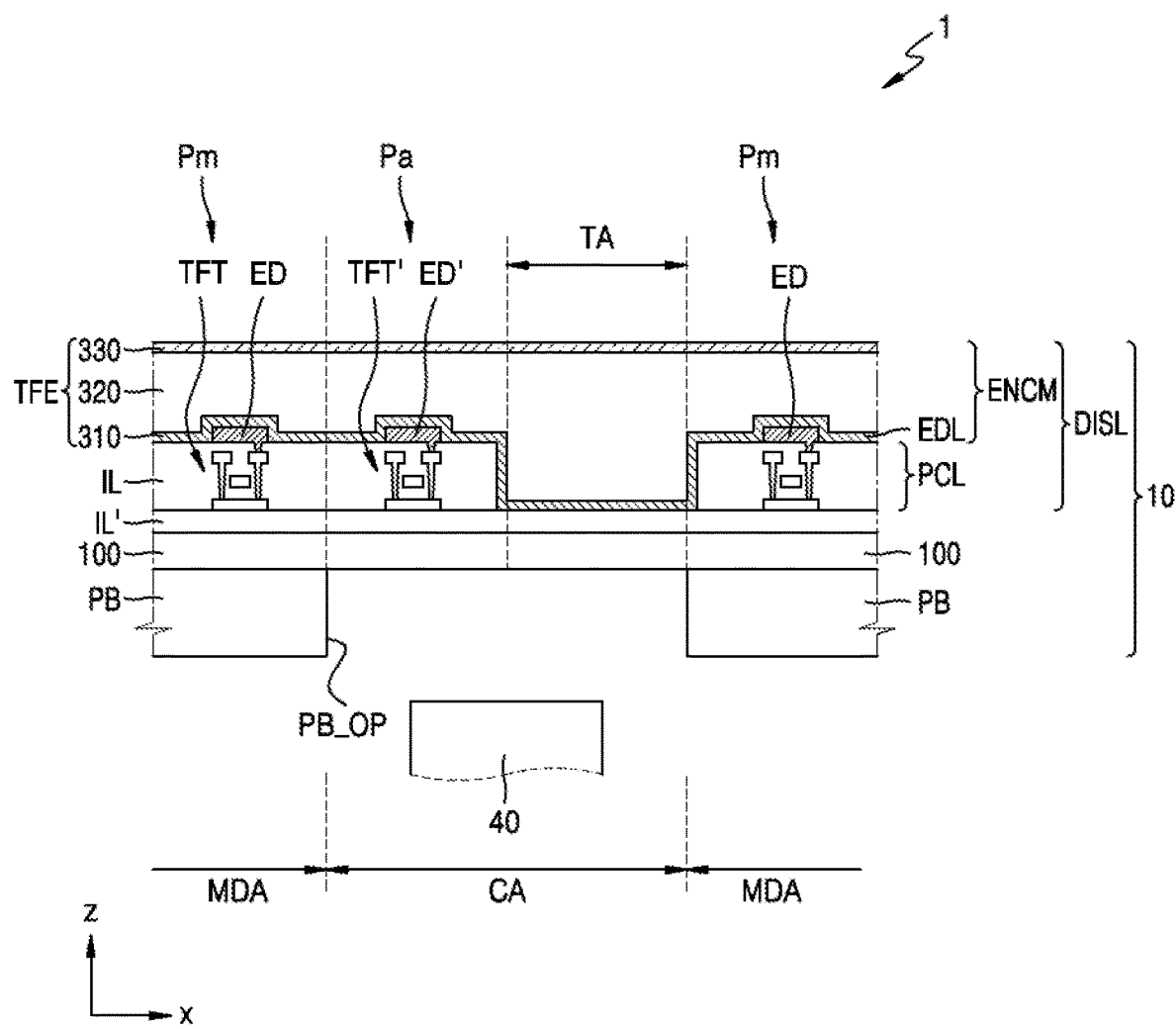
FIG. 2 is a cross-sectional view illustrating a display apparatus according to an exemplary embodiment of the present disclosure.

FIG. 2 is a cross-sectional view illustrating a display apparatus according to an exemplary embodiment of the present disclosure.

Referring to FIG. 2, the display apparatus 1 may include a display panel 10 and the component 40 overlapping the display panel 10. A cover window for protecting the display panel 10 may be further located on the display panel 10, and the cover window may be formed of an insulating material such as, for example, glass, quartz, and/or a polymer resin.

The display panel 10 includes the component area CA overlapping the component 40 and the main display area MDA where a main image is displayed. The display panel 10 may include the first substrate 100, a display layer DISL located on the first substrate 100, and a protective member PB located under the first substrate 100. For example, the protective member PB may be arranged on a back surface of the first substrate 100.

The display layer DISL may include a circuit layer PCL including main and auxiliary thin-film transistors TFT and TFT', a display element layer EDL including main and auxiliary light-emitting devices ED and ED' that are display elements, and a sealing member ENCM such as a thin-film encapsulation layer TFE. Insulating layers IL and IL' may be located between the first substrate 100 and the display layer DISL, and may be formed in the display layer DISL.

The first substrate 100 may be formed of an insulating material such as, for example, glass, quartz, and/or a polymer resin. The polymer resin may be transparent, and may be provided such that at least a part of the first substrate 100 may be easily bent. The first substrate 100 may be a rigid substrate, or a flexible substrate that is bendable, foldable, or rollable. For example, the first substrate 100 may include transparent polyimide (PI).

The main thin-film transistor TFT and the main light-emitting device ED connected to the main thin-film transistor TFT may be located in the main display area MDA of the display panel 10 to form the main sub-pixel Pm, and the auxiliary thin-film transistor TFT' and the auxiliary light-emitting device ED' connected to the auxiliary thin-film transistor TFT' may be located in the component area CA to form the auxiliary sub-pixel Pa. A portion of the component area CA where the auxiliary sub-pixel Pa is located may be referred to as an auxiliary display area.

The transmission area TA where a display element is not located may be located in the component area CA. The transmission area TA may be an area through which light or a signal emitted from the component 40 located to correspond to the component area CA or light or a signal incident on the component 40 is transmitted. Also, the transmission area TA may be an area through which sound output from the component 40 to the outside or traveling from the outside toward the component 40 may be transmitted. The auxiliary display area and the transmission area TA may be alternately arranged in the component area CA.

The display element layer EDL may be covered by the thin-film encapsulation layer TFE, or may be covered by a sealing substrate. The thin-film encapsulation layer TFE may cover the main and auxiliary light-emitting devices ED and ED' in the main display area MDA and the component area CA, and may prevent the main and auxiliary light-emitting devices ED and ED' from being damaged or degraded by external impurities. In an exemplary embodiment of the present disclosure, the thin-film encapsulation layer TFE may include at least one inorganic encapsulation layer and at least one organic encapsulation layer. In an exemplary embodiment of the present disclosure, the thin-film encapsulation layer TFEL may include a first inorganic encapsulation layer 310, a second inorganic encapsulation layer 330, and an organic encapsulation layer 320 located between the first inorganic encapsulation layer 310 and the second inorganic encapsulation layer 330 as shown in FIG. 2. In the present exemplary embodiment, each of the first inorganic encapsulation layer 310, the organic encapsulation layer 320, and the second inorganic encapsulation layer 330 is shown as a single layer, but the present disclosure is not limited thereto. For example, in an exemplary embodiment of the present disclosure, at least one of the first inorganic encapsulation layer 310, the organic encapsulation layer 320, and the second inorganic encapsulation layer 330 may be provided in plurality or may be omitted.

Each of the first and second inorganic encapsulation layers 310 and 330 may include at least one inorganic insulating material selected from among, for example, aluminum oxide ($Al_2O_3$), titanium oxide ($TiO_2$), tantalum oxide ($Ta_2O_5$), hafnium oxide ($HfO_2$), zinc oxide (ZnO), silicon oxide ($SiO_2$), silicon nitride ($SiN_x$), and silicon oxynitride (SiON). The organic encapsulation layer 320 may include a polymer-based material. Examples of the polymer-based material may include, for example, an acrylic resin, an epoxy resin, polyimide, and polyethylene. The organic encapsulation layer 320 may provide a flat surface on the first inorganic encapsulation layer 310, and may relieve the stress between the contacting layers.

When the display element layer EDL is sealed by a sealing substrate, the sealing substrate may face the first substrate 100 with the display element layer EDL interposed therebetween. There may be a gap between the sealing substrate and the display element layer EDL. The sealing substrate may include glass. A sealant such as frit may be located between the first substrate 100 and the sealing substrate to bond the sealing substrate to the first substrate 100, and the sealant may be located in the peripheral area DPA. The sealant located in the peripheral area DPA may surround the display area DA to prevent moisture from penetrating through a side surface.

The protective member PB may be attached to the bottom of the first substrate 100, and may support and protect the first substrate 100. The protective member PB may have an opening PB_OP corresponding to the component area CA. Because the protective member PB has the opening PB_OP, the protective member PB may enhance a light transmittance of the component area CA. The protective member PB may include, for example, polyethylene terephthalate (PET) or polyimide (PI).

The area of the component area CA may be greater than the area of a region where the component 40 is located. Accordingly, the area of the opening PB_OP of the protective member PB may not be the same as the area of the component area CA. The component 40 may include an element (or elements) related to a function of the display panel 10 as described above, or may include an element such as an accessory for enhancing the beauty of the display panel 10.

A plurality of components 40 may be located in the component area CA. The plurality of components 40 may have different functions. For example, the plurality of components 40 may include at least two of, for example, a camera (imaging device), a solar cell, a speaker, a flash light, a proximity sensor, a thermal detection sensor, an illuminance sensor, and an iris sensor.

Figure 3:
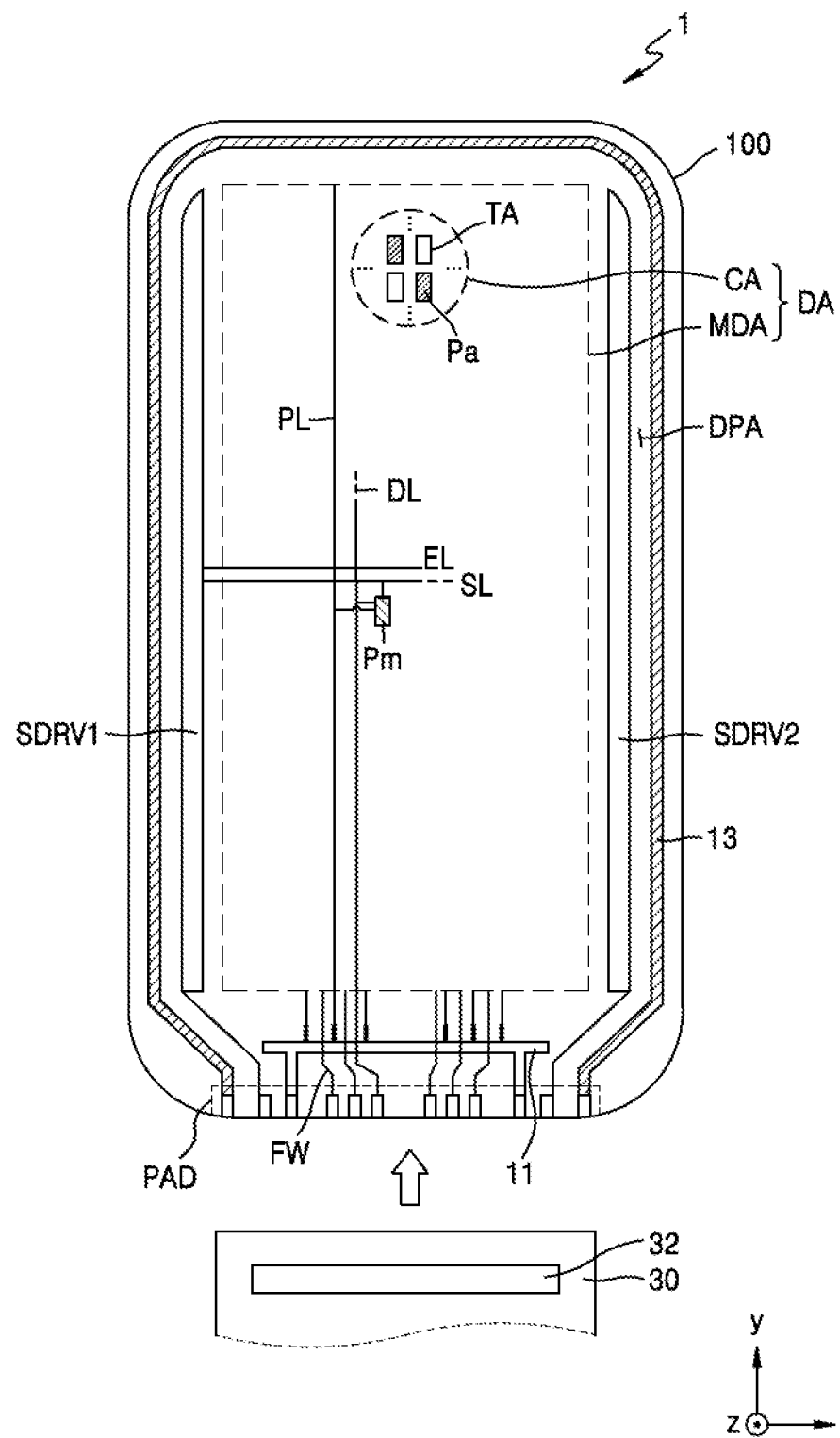
FIG. 3 is a plan view illustrating a display apparatus according to an exemplary embodiment of the present disclosure.

FIG. 3 is a plan view illustrating a display apparatus according to an exemplary embodiment of the present disclosure.

Referring to FIG. 3, various elements of the display apparatus 1 are located on the first substrate 100. The first substrate 100 includes the display area DA, and a peripheral area DPA surrounding the display area DA. The display area DA includes the main display area MDA where a main image is displayed, and the component area CA that includes the transmission area TA and the auxiliary display area where an auxiliary image is displayed. The auxiliary image may constitute one whole image along with the main image, or the auxiliary image may be an image independent from the main image.

A plurality of main sub-pixels Pm are located in the main display area MDA. Each of the main sub-pixels Pm may be implemented as an organic light-emitting diode (OLED). Each main sub-pixel Pm may emit, for example, red, green, blue, or white light. A predetermined main image may be produced in the main display area MDA through light emitted from the main sub-pixels Pm. The main display area MDA may be covered by a sealing member, and may be protected from external air or moisture.

The component area CA may be located at a side of the main display area MDA, or may be located inside the display area DA and may be surrounded by the main display area MDA as described above. A plurality of auxiliary sub-pixels Pa are located in the component area CA. For example, the plurality of auxiliary sub-pixels Pa may be located in the auxiliary display area. Each of the plurality of auxiliary sub-pixels Pa may be implemented as a display element such as an organic light-emitting diode (OLED). Each auxiliary sub-pixel Pa may emit, for example, red, green, blue, or white light. A predetermined auxiliary image may be produced in the component area CA through light emitted from the auxiliary sub-pixels Pa. The component area CA may be covered by a sealing member, and may be protected from external air or moisture.

The component area CA may include the transmission area TA. The transmission area TA may be located to surround the plurality of auxiliary sub-pixels Pa. Alternatively, the transmission areas TA and the plurality of auxiliary sub-pixels Pa may be arranged in a lattice shape. For example, the auxiliary display area and the transmission area TA may be alternately arranged in the component area CA, or the auxiliary display area may be surrounded by the transmission area TA.

Because the component area CA includes the transmission area TA, a resolution of the component area CA may be less than a resolution of the main display area MDA. For example, the number of auxiliary sub-pixels Pa that may be located per unit area in the component area may be less than the number of main sub-pixels Pm located per unit area in the main display area MDA. For example, a resolution of the component area CA may be about $\frac{1}{2}$, $\frac{3}{8}$, $\frac{1}{3}$, $\frac{1}{4}$, $\frac{2}{9}$, $\frac{1}{8}$, $\frac{1}{9}$, or $\frac{1}{16}$ of that of the main display area MDA. For example, a resolution of the main display area MDA may be about 400 ppi or more, and a resolution of the component area CA may be about 200 ppi or about 100 ppi.

Pixel circuits for driving the main and auxiliary sub-pixels Pm and Pa may be respectively electrically connected to outer circuits located in the peripheral area DPA. A first scan driving circuit SDRV1, a second scan driving circuit SDRV2, a terminal PAD, a driving voltage supply line 11, and a common voltage supply line 13 may be located in the peripheral area DPA.

The first scan driving circuit SDRV1 may apply a scan signal to each of the pixel circuits for driving the main and auxiliary sub-pixels Pm and Pa through a scan line SL. The first scan driving circuit SDRV1 may apply an emission control signal to each pixel circuit through an emission control line EL. The second scan driving circuit SDRV2 may be located opposite to the first scan driving circuit SDRV1 with the main display area MDA interposed therebetween, and may be substantially parallel to the first scan driving circuit SDRV1. Some of the pixel circuits of the main sub-pixels Pm located in the main display area MDA may be electrically connected to the first scan driving circuit SDRV1, and the others may be electrically connected to the second scan driving circuit SDRV2. Some of the pixel circuits of the auxiliary sub-pixels Pa located in the component area CA may be electrically connected to the first scan driving circuit SDRV1, and the others may be electrically connected to the second scan driving circuit SDRV2. In an exemplary embodiment of the present disclosure, the second scan driving circuit SDRV2 may be omitted. For example, only the first scan driving circuit SDRV1 may be arranged on only one side of the main display area MDA.

The terminal PAD may be located at a side of the first substrate 100. The terminal PAD is exposed by but not covered by an insulating layer and is connected to a display circuit board 30. A display driver 32 may be located on the display circuit board 30. The display circuit board 30 may be a flexible printed circuit board.

The display driver 32 may generate a control signal transmitted to the first scan driving circuit SDRV1 and the second scan driving circuit SDRV2. The display driver 32 may generate a data signal, and the generated data signal may be transmitted to the pixel circuits of the main and auxiliary sub-pixels Pm and Pa through a fan-out line FW and a data line DL connected to the fan-out line FW. For example, the display driver 32 may receive a vertical synchronization signal, a horizontal synchronization signal, and a clock signal, generate control signals for controlling driving of the first scan driving circuit SDRV1 and the second scan driving circuit SDRV2, and transfer the relevant control signals to the relevant elements.

The display driver 32 may supply a driving voltage ELVDD to the driving voltage supply line 11, and may supply a common voltage ELVSS to the common voltage supply line 13 through the terminal PAD. The driving voltage ELVDD may be supplied to the pixel circuits of the main and auxiliary sub-pixels Pm and Pa through a driving voltage line PL connected to the driving voltage supply line 11, and the common voltage ELVSS may be supplied to a counter electrode of a display element connected to the common voltage supply line 13.

The driving voltage supply line 11 may be located under the main display area MDA and may extend in an X-direction. The common voltage supply line 13 may partially surround the main display area MDA in a loop shape having one open side, at which the terminal PAD is located. The driving voltage supply line 11 provides the driving voltage ELVDD to the main and auxiliary sub-pixels Pm and Pa, and may be connected to a plurality of driving voltage lines PL arranged in the X-direction and extending in a Y-direction.

Figure 4:
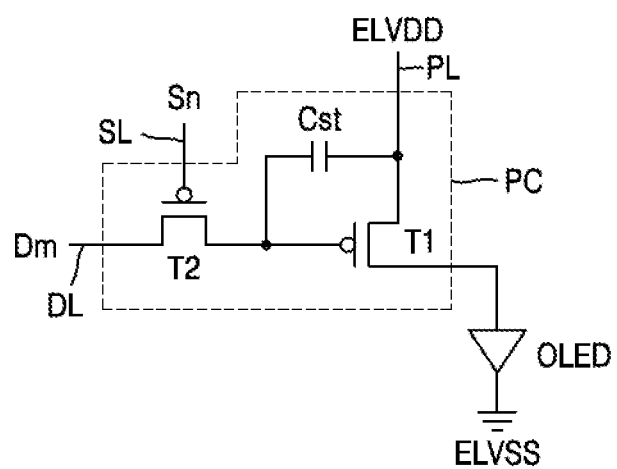
FIGS. 4 and 5 are equivalent circuit diagrams of a pixel that may be included in a display apparatus according to an exemplary embodiment of the present disclosure.
Figure 5:
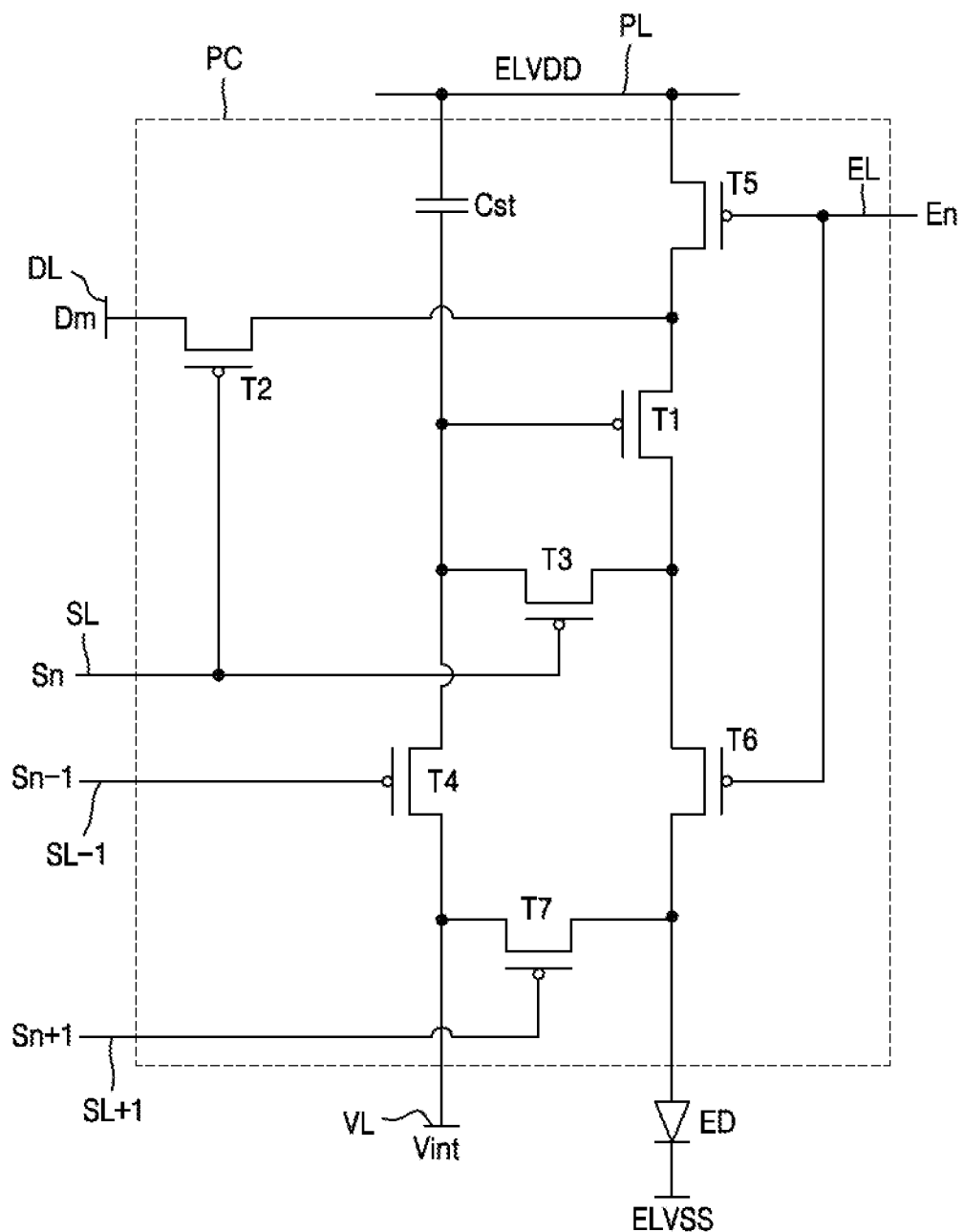

FIGS. 4 and 5 are equivalent circuit diagrams of a sub-pixel that may be included in a display apparatus according to an exemplary embodiment of the present disclosure.

Referring to FIG. 4, a pixel circuit PC may be connected to an organic light-emitting diode OLED so that sub-pixels may emit light. The pixel circuit PC includes a driving thin-film transistor (TFT) T1, a switching TFT T2, and a storage capacitor Cst. The switching TFT T2 is connected to the scan line SL and the data line DL, and transmits a data signal Dm input through the data line DL to the driving TFT T1 according to a scan signal Sn input through the scan line SL.

The storage capacitor Cst is connected to the switching TFT T2 and the driving voltage line PL, and stores a voltage corresponding to a difference between a voltage received from the switching TFT T2 and the driving voltage ELVDD supplied to the driving voltage line PL. For example, the storage capacitor Cst may include a first electrode connected to the switching TFT T2 and a second electrode receiving the driving voltage ELVDD. Also, the storage capacitor Cst may be charged with a voltage corresponding to the data signal Dm received from the switching TFT T2.

The driving TFT T1 may be connected to the driving voltage line PL and the storage capacitor Cst, and may control driving current flowing through the organic light-emitting diode OLED from the driving voltage line PL in response to a value of a voltage stored in the storage capacitor Cst. The organic light-emitting diode OLED may emit light having a certain luminance according to the driving current.

Although the pixel circuit PC includes two TFTs and one storage capacitor in FIG. 4, the present disclosure is not limited thereto. The number of TFTs and the number of storage capacitors may be changed in various ways according to a design of the pixel circuit PC. For example, the pixel circuit PC may include three, four, five, six, seven or more TFTs instead of the above two TFTs.

Referring to FIG. 5, the pixel circuit PC may include the driving TFT T1, the switching TFT T2, a compensation TFT T3, a first initialization TFT T4, an operation control TFT T5, an emission control TFT T6, a second initialization TFT T7, and the storage capacitor Cst.

Although each pixel circuit PC includes signal lines (e.g., the scan line SL, a previous scan line SL−1, a subsequent scan line SL+1, the emission control line EL, and the data line DL), an initialization voltage line VL, and the driving voltage line PL in FIG. 5, the present disclosure is not limited thereto. In an exemplary embodiment of the present disclosure, at least one of the signal lines (e.g., the scan line SL, the previous scan line SL−1, the subsequent scan line SL+1, the emission control line EL, and the data line DL) and/or the initialization voltage line VL may be shared by neighboring pixel circuits.

A gate electrode of the driving TFT T1 may be connected to one electrode of the storage capacitor Cst. A drain electrode of the driving TFT T1 may be electrically connected to an anode of the light-emitting device ED via the emission control TFT T6. The driving TFT T1 receives the data signal Dm according to a switching operation of the switching TFT T2, and supplies driving current to the light-emitting device ED.

A gate electrode of the switching TFT T2 is connected to the scan line SL, and a source electrode of the switching TFT T2 is connected to the data line DL. A drain electrode of the switching TFT T2 may be connected to a source electrode of the driving TFT T1, and may be connected to the driving voltage line PL via the operation control TFT T5. For example, the drain electrode of the switching TFT T2 may be connected to a drain electrode of the operation control TFT T5.

The switching TFT T2 is turned on according to the scan signal Sn received through the scan line SL, and performs a switching operation of transmitting the data signal Dm through the data line DL to the source electrode of the driving TFT T1.

A gate electrode of the compensation TFT T3 may be connected to the scan line SL. A source electrode of the compensation TFT T3 may be connected to the drain electrode of the driving TFT T1, and may be connected to a pixel electrode (e.g., an anode) of the light-emitting device ED via the emission control TFT T6. A drain electrode of the compensation TFT T3 may be connected to one electrode of the storage capacitor Cst, a drain electrode of the first initialization TFT T4, and the gate electrode of the driving TFT T1. The compensation TFT T3 is turned on according to the scan signal Sn received through the scan line SL and diode-connects the driving TFT T1 by connecting the gate electrode and the drain electrode of the driving TFT T1.

A gate electrode of the first initialization TFT T4 may be connected to the previous scan line SL−1. A source electrode of the first initialization TFT T4 may be connected to the initialization voltage line VL. The drain electrode of the first initialization TFT T4 may be connected to one electrode of the storage capacitor Cst, the drain electrode of the compensation TFT T3, and the gate electrode of the driving TFT T1. The first initialization TFT T4 may be turned on according to a previous scan signal Sn−1 received through the previous scan line SL−1, and may perform an initialization operation of initializing a voltage of the gate electrode of the driving TFT T1 by supplying an initialization voltage Vint to the gate electrode of the driving TFT T1.

In an exemplary embodiment of the present disclosure, the compensation TFT T3 and the first initialization TFT T4 may each be configured to have a dual gate structure to cut off a leakage current. However, the present disclosure is not limited thereto.

A gate electrode of the operation control TFT T5 may be connected to the emission control line EL. A source electrode of the operation control TFT T5 may be connected to the driving voltage line PL. A drain electrode of the operation control TFT T5 is connected to the source electrode of the driving TFT T1 and the drain electrode of the switching TFT T2.

A gate electrode of the emission control TFT T6 may be connected to the emission control line EL. A source electrode of the emission control TFT T6 may be connected to the drain electrode of the driving TFT T1 and the source electrode of the compensation TFT T3. A drain electrode of the emission control TFT T6 may be electrically connected to the pixel electrode of the light-emitting device ED. The operation control TFT T5 and the emission control TFT6 are simultaneously turned on according to an emission control signal En received through the emission control line EL, and thus the driving voltage ELVDD is compensated by the diode-connected driving TFT T1 and is supplied to the light-emitting device ED and driving current flows through the light-emitting device ED.

A gate electrode of the second initialization TFT T7 may be connected to the subsequent scan line SL+1. A source electrode of the second initialization TFT T7 may be connected to the pixel electrode of the light-emitting device ED. A drain electrode of the second initialization TFT T7 may be connected to the initialization voltage line VL. The second initialization TFT T7 may be turned on according to a subsequent scan signal Sn+1 received through the subsequent scan line SL+1 and may initialize the pixel electrode of the light-emitting device ED.

Although the first initialization TFT T4 and the second initialization TFT T7 are respectively connected to the previous scan line SL−1 and the subsequent scan line SL+1 in FIG. 5, the present disclosure is not limited thereto. In an exemplary embodiment of the present disclosure, both the first initialization TFT T4 and the second initialization TFT T7 may be connected to the previous scan line SL−1 and may be driven according the previous scan signal Sn−1. For example, since the subsequent scan signal Sn+1 may be substantially the same as the previous scan signal Sn−1, a separate subsequent scan line SL+1 may not be disposed and the subsequent scan signal Sn+1 may be transmitted through the previous scan line SL−1.

The other electrode of the storage capacitor Cst may be connected to the driving voltage line PL which transmits the driving voltage ELVDD. The one electrode of the storage capacitor Cst may be connected to the gate electrode of the driving TFT T1, the drain electrode of the compensation TFT T3, and the drain electrode of the first initialization TFT T4.

A counter electrode (e.g., a cathode) of the light-emitting device ED receives the common voltage ELVSS. The light-emitting device ED receives driving current from the driving TFT T1 and emits light.

The number of TFTs and storage capacitors and a circuit design of the pixel circuit PC are not limited to those of FIG. 5, and may be modified in various ways. The pixel circuits PC for driving the main sub-pixel Pm and the auxiliary sub-pixel Pa may be provided in the same manner or different manners.

Figure 6:
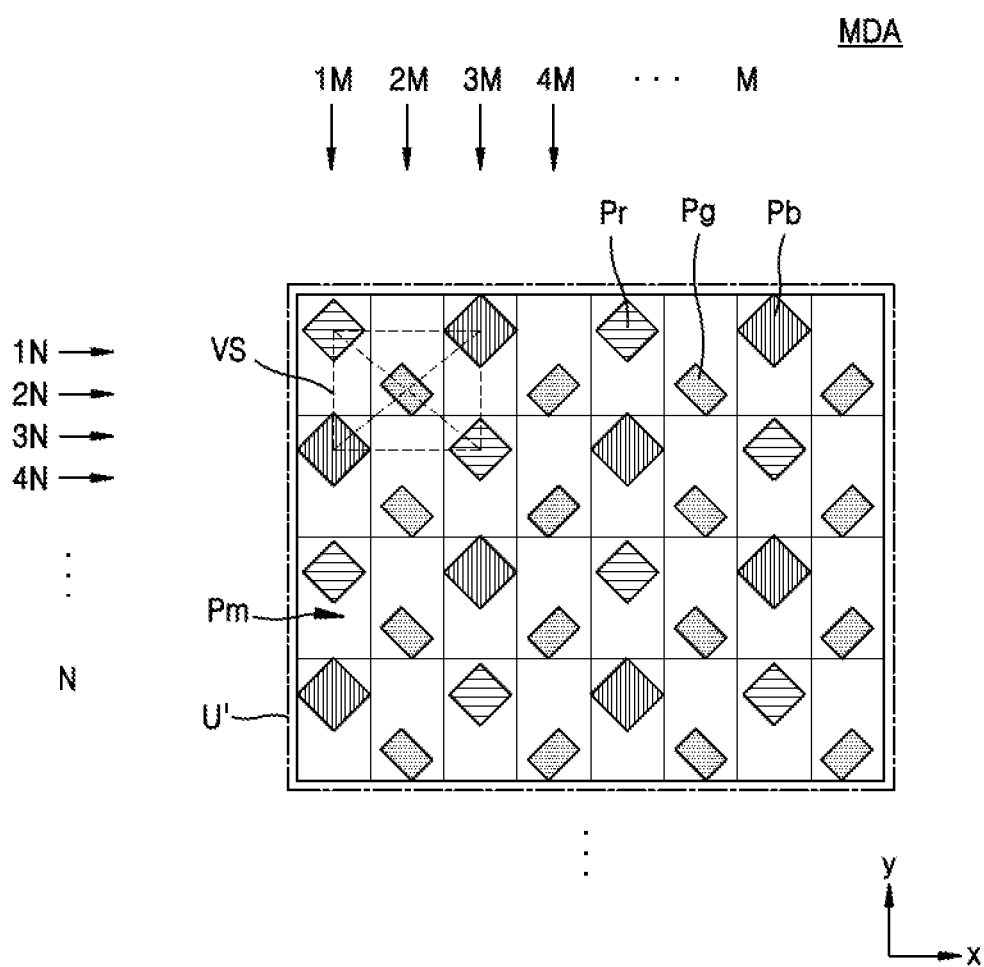
FIG. 6 is a view illustrating a pixel arrangement structure in a main display area according to an exemplary embodiment of the present disclosure.

FIG. 6 is a view illustrating a pixel arrangement structure in a main display area according to an exemplary embodiment of the present disclosure.

A plurality of main sub-pixels Pm may be located in the main display area MDA. The term 'sub-pixel' used herein refers to an emission area that is a minimum unit for forming an image. When an organic light-emitting diode is used as a display element, the emission area may be defined by an opening of a pixel-defining film, which will be described below.

As shown in FIG. 6, the main sub-pixels Pm located in the main display area MDA may be arranged in a pentile structure. A red sub-pixel Pr, a green sub-pixel Pg, and a blue sub-pixel Pb may respectively represent red, green, and blue colors.

A plurality of red sub-pixels Pr and a plurality of blue sub-pixels Pb are alternately arranged in a first row 1N, a plurality of green sub-pixels Pg are arranged at certain intervals in a second row 2N adjacent to the first row 1N, a plurality of blue sub-pixels Pb and a plurality of red sub-pixels Pr are alternately arranged in a third row 3N adjacent to the second row 2N, a plurality of green sub-pixels Pg are arranged at certain intervals in a fourth row 4N adjacent to the third row 3N, and such a pixel arrangement is repeated to an $N^{th}$ row. In this case, the blue sub-pixels Pb and the red sub-pixels Pr may be larger than the green sub-pixels Pg. Also, the blue sub-pixels Pb may be larger than the red sub-pixels Pr, but the present disclosure is not limited thereto.

The plurality of red sub-pixels Pr and the plurality of blue sub-pixels Pb located in the first row 1N and the plurality of green sub-pixels Pg located in the second row 2N are alternately arranged. Accordingly, a plurality of red sub-pixels Pr and a plurality of blue sub-pixels Pb are alternately arranged in a first column 1M, a plurality of green sub-pixels Pg are arranged at certain intervals in a second column 2M adjacent to the first column 1M, a plurality of blue sub-pixels Pb and a plurality of red sub-pixels Pr are alternately arranged in a third column 3M adjacent to the second column 2M, a plurality of green sub-pixels Pg are arranged at certain intervals in a fourth column 4M adjacent to the third column 3M, and such a pixel arrangement is repeated to an $M^{th}$ column.

From among vertices of a virtual quadrangular shape VS having a center point of the green sub-pixel Pg as a center point of the virtual quadrangular shape VS, the red sub-pixels Pr may be located at first and third vertices that face each other, and the blue sub-pixels Pb may be located at second and fourth vertices that are the remaining vertices. In this case, the virtual quadrangular shape VS may be modified to any of various shapes such as, for example, a rectangular shape, a diamond shape, or a square shape.

Such a pixel arrangement structure may be referred to as a pentile matrix structure or a pentile structure, and a rendering driving method that represents a color by sharing adjacent pixels may be used, thereby displaying an image having a high resolution with a small number of pixels. In the pixel arrangement structure described above, the blue sub-pixels Pb and the red sub-pixels Pr may be larger than the green sub-pixels Pg, but the number of green sub-pixels Pg may be twice of the number of the blue sub-pixels Pb and twice of the number the red sub-pixels Pr.

Although the plurality of main sub-pixels Pm are arranged in a pentile matrix structure in FIG. 6, the present disclosure is not limited thereto. For example, the plurality of main sub-pixels Pm may be arranged in any of various structures such as a stripe structure, a mosaic structure, or a delta structure.

Figure 7:
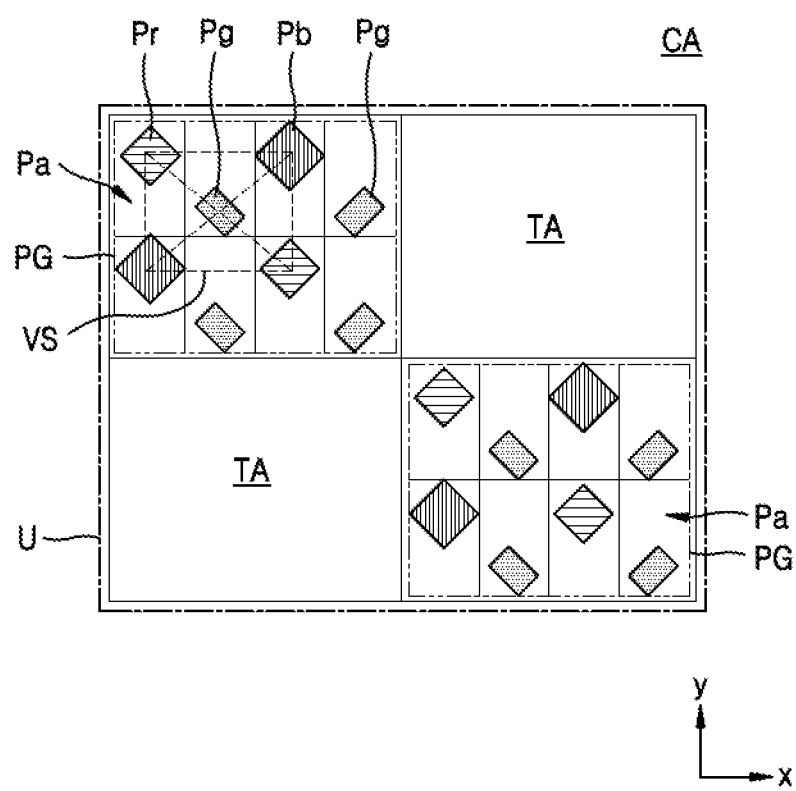
FIGS. 7 and 8 are views each illustrating a pixel arrangement structure in a component area according to an exemplary embodiment of the present disclosure.
Figure 8:
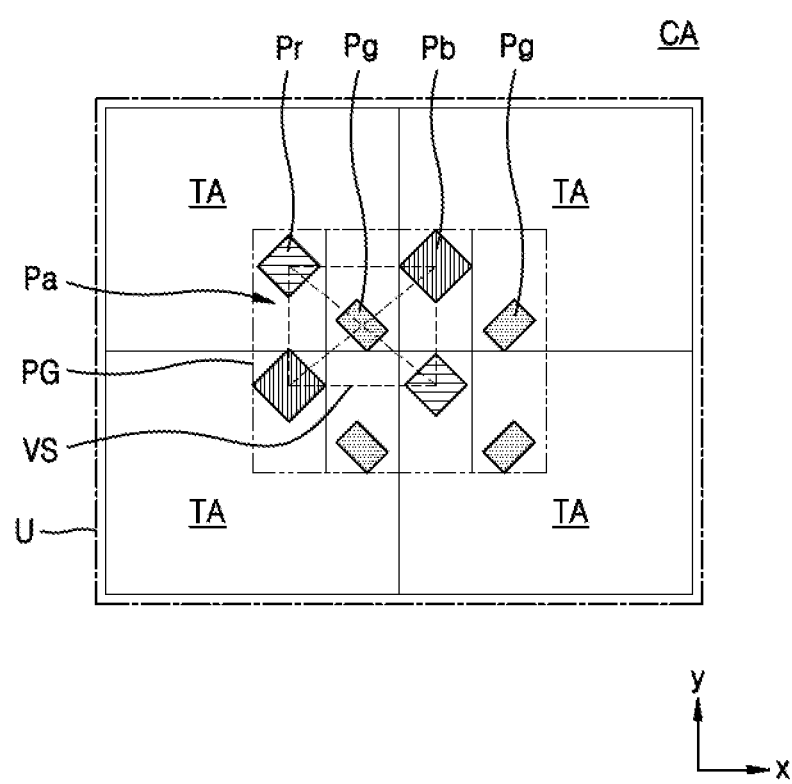

FIGS. 7 and 8 are views each illustrating a pixel arrangement structure in a component area according to an exemplary embodiment of the present disclosure.

Referring to FIG. 7, a plurality of auxiliary sub-pixels Pa may be located in the component area CA. Each of the auxiliary sub-pixels Pa may emit red, green, blue, or white light.

The component area CA may include a pixel group PG including at least one auxiliary sub-pixel Pa and the transmission area TA. The pixel group PG and the transmission area TA may be alternately arranged in an X-direction and a Y-direction, for example, in a lattice shape. In this case, the component area CA may include a plurality of pixel groups PG and a plurality of transmission areas TA.

The pixel group PG may be defined as a preset unit in which a plurality of auxiliary sub-pixels Pa are grouped. For example, as shown in FIG. 7, one pixel group PG may include eight auxiliary sub-pixels Pa arranged in a pentile structure. That is, two red sub-pixels Pr, four green sub-pixels Pg, and two blue sub-pixels Pb may be included in one pixel group PG. In this case, the red sub-pixels Pr, the green sub-pixels Pg, and the blue sub-pixels Pb of the auxiliary sub-pixels Pa may be arranged in a pentile matrix structure in one pixel group PG, and may be arranged in a way the same as that of the red sub-pixels Pr, the green sub-pixels Pg, and the blue sub-pixels Pb of the main sub-pixels Pm is arranged.

A basic unit U including a certain number of pixel groups PG and a certain number of transmission areas TA may be repeatedly arranged in the X-direction and the Y-direction in the component area CA. In FIG. 7, the basic unit U may have a quadrangular shape in which two pixel groups PG and two transmission areas TA around the two pixel groups PG are grouped. The basic unit U is a repeating shape and does not mean separation of elements.

A corresponding unit U' having the same area as the area of the basic unit U may be configured in the main display area MDA. In this case, the number of main sub-pixels Pm included in the corresponding unit U' may be greater than the number of auxiliary sub-pixels Pa included in the basic unit U. That is, the number of auxiliary sub-pixels Pa included in the basic unit U may be 16, and the number of main sub-pixels Pm included in the corresponding unit U' may be 32, and a ratio between the number of auxiliary sub-pixels Pa and the number of main sub-pixels Pm per same area may be 1:2.

As shown in FIG. 7, an arrangement structure of the auxiliary sub-pixels Pa is a pentile structure, and a pixel arrangement structure of the component area CA whose resolution is one-half (½) of that of the main display area MDA is a ½ pentile structure. The number or an arrangement method of the auxiliary sub-pixels Pa included in the pixel group PG may be modified and designed according to a resolution of the component area CA.

Referring to FIG. 8, a pixel arrangement structure of the component area CA may be a ¼ pentile structure. Although eight auxiliary sub-pixels Pa are arranged in a pentile structure in the pixel group PG in the present exemplary embodiment, only one pixel group PG may be included in the basic unit U. The transmission area TA may be included in a remaining portion of the basic unit U. That is, the number of auxiliary sub-pixels Pa included in the basic unit U may be 8, and the number of main sub-pixels Pm included in the corresponding unit U' may be 32. A ratio between the number of auxiliary sub-pixels Pa and the number of main sub-pixels Pm per same area may be 1:4. For example, the resolution of the component area CA is one-fourth (¼) of that of the main display area MDA. In this case, one pixel group PG may be surrounded by the transmission area TA in the basic unit U.

Figure 9:
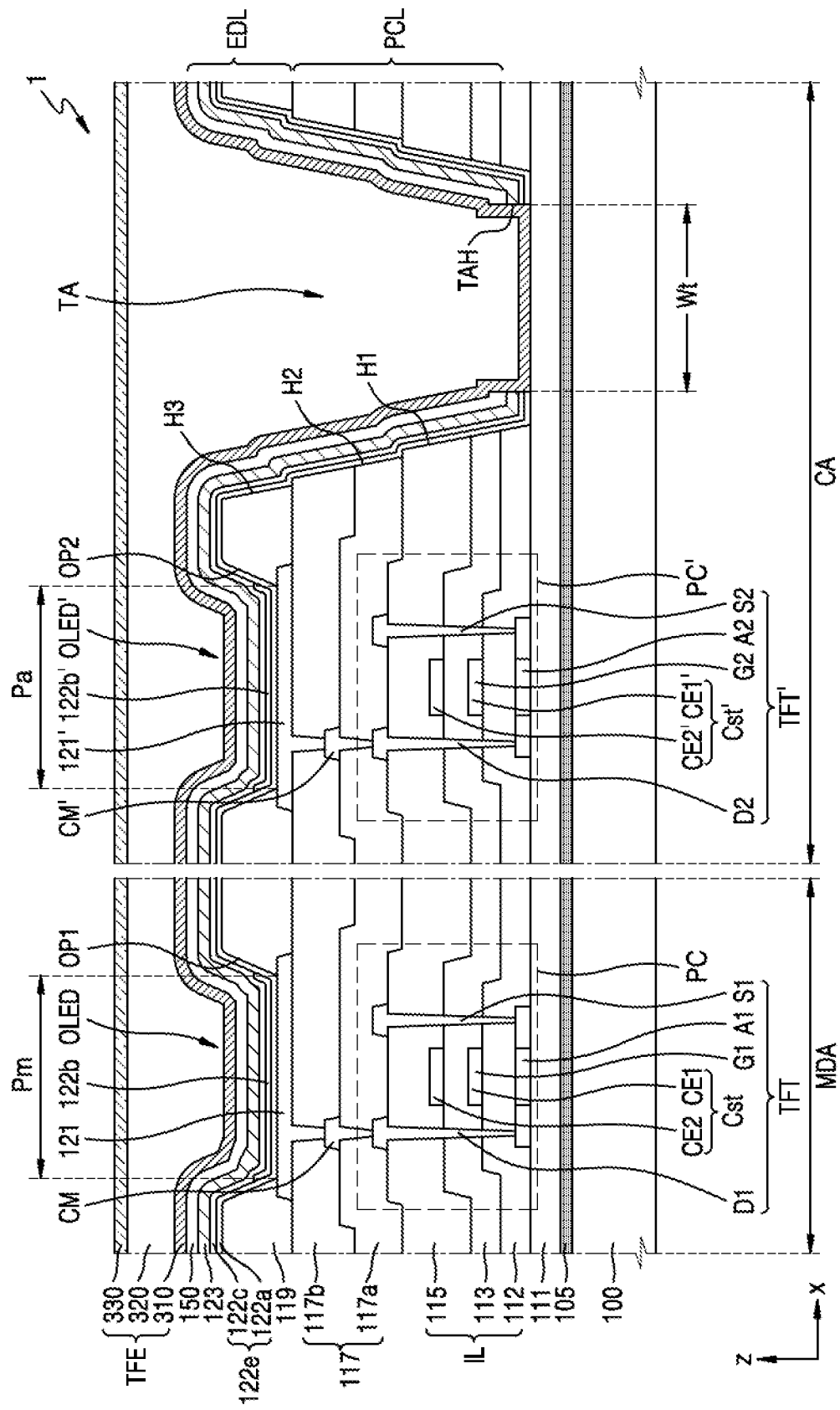
FIG. 9 is a cross-sectional view illustrating a display apparatus according to an exemplary embodiment of the present disclosure.

FIG. 9 is a cross-sectional view illustrating a display apparatus according to an exemplary embodiment of the present disclosure. FIG. 9 is a cross-sectional view illustrating the main display area MDA and the component area CA of the display apparatus 1 according to an exemplary embodiment of the present disclosure.

Referring to FIG. 9, the display apparatus 1 includes the main display area MDA and the component area CA. The main sub-pixel Pm is located in the main display area MDA, and the auxiliary sub-pixel Pa is located in the component area CA. The component area CA includes the transmission area TA.

A main pixel circuit PC including a main thin-film transistor TFT and a main storage capacitor Cst, and a main organic light-emitting diode OLED that is a display element connected to the main pixel circuit PC may be located in the main display area MDA. For example, the main pixel circuit PC may be located on the first substrate 100 to correspond to the main display area MDA, and may include a main display element (e.g., main organic light-emitting diode OLED) and a first semiconductor layer A1 (to be described) connected to the main display element. An auxiliary pixel circuit PC' including an auxiliary thin-film transistor TFT' and an auxiliary storage capacitor Cst', and an auxiliary organic light-emitting diode OLED' that is a display element connected to the auxiliary pixel circuit PC' may be located in the component area CA. For example, the auxiliary pixel circuit PC' may be located on the first substrate 100 to correspond to the component area CA, and may include an auxiliary display element (e.g., auxiliary organic light-emitting diode OLED') and a second semiconductor layer A2 (to be described) connected to the auxiliary display element.

Although an organic light-emitting diode is used as a display element in the present exemplary embodiment, an inorganic light-emitting device or a quantum-dot light-emitting device may be used as a display element in an exemplary embodiment of the present disclosure. A light emitting layer of the quantum dot light-emitting display apparatus may include a quantum dot and/or a quantum rod.

A structure in which elements included in the display apparatus 1 are stacked will now be described. In the display apparatus 1, the first substrate 100, a buffer layer 111, a circuit layer PCL, a display element layer EDL, and the thin-film encapsulation layer TFE may be stacked.

As described above, the first substrate 100 may be formed of an insulating material such as, for example, glass, quartz, or a polymer resin. The polymer resin may be transparent, and may be provided such that at least a part of the first substrate 100 may be easily bent. The first substrate 100 may be a rigid substrate, or a flexible substrate that is bendable, foldable, or rollable. For example, the first substrate 100 may include transparent polyimide (PI).

The buffer layer 111 may be located on the first substrate 100. Various modifications may be made. For example, the buffer layer 111 may be located on the first substrate 100, and may have a thickness ranging from about 6000 Å to about 10000 Å, for example, ranging from about 7000 Å to about 10000 Å, or for example, ranging from about 6000 Å to about 9000 Å. For example, in an exemplary embodiment of the present disclosure, the buffer layer 111 may have a thickness ranging from about 7000 Å to about 9000 Å and may be located on the first substrate 100. The buffer layer 111 may be located on the first substrate 100, and thus may reduce or prevent penetration of an external material, moisture, or external air from the bottom of the first substrate 100 and may planarize the first substrate 100. The buffer layer 111 may include an inorganic material such as oxide or nitride, an organic material, or a combination of an organic material and an inorganic material, and may have a single or multi-layer structure including an inorganic material and an organic material. In an exemplary embodiment of the present disclosure, the buffer layer 111 may include silicon oxide ($SiO_2$) or silicon nitride ($SiN_x$). The buffer layer 111 may have an opening corresponding to the transmission area TA. In an exemplary embodiment of the present disclosure, the silicon nitride ($SiN_x$) included in the buffer layer 111 may be a nitrogen rich silicon nitride ($SiN_x$) with nitrogen to silicon ratio (N/Si) greater than 4/3. That is, x in the formula $SiN_x$ of the nitrogen rich silicon nitride included in the buffer layer 111 is greater than 4/3.

The circuit layer PCL may be located on the buffer layer 111, and may include the main and auxiliary pixel circuits PC and PC', a first insulating layer 112, a second insulating layer 113, a third insulating layer 115, and a planarization layer 117. The main pixel circuit PC may include the main thin-film transistor TFT and the main storage capacitor Cst, and the auxiliary pixel circuit PC' may include the auxiliary thin-film transistor TFT' and the auxiliary storage capacitor Cst'.

The main thin-film transistor TFT and the auxiliary thin-film transistor TFT' may be located on the buffer layer 111. The main thin-film transistor TFT may include a first semiconductor layer A1, a first gate electrode G1, a first source electrode S1, and a first drain electrode D1, and the auxiliary thin-film transistor TFT' may include a second semiconductor layer A2, a second gate electrode G2, a second source electrode S2, and a second drain electrode D2. The main thin-film transistor TFT may be connected to the main organic light-emitting diode OLED and may drive the main organic light-emitting diode OLED. For example, the first drain electrode D1 of the main thin-film transistor TFT may be connected to the first pixel electrode 121 of the main organic light-emitting diode OLED. The auxiliary thin-film transistor TFT' may be connected to the auxiliary organic light-emitting diode OLED' and may drive the auxiliary organic light-emitting diode OLED'. For example, the second drain electrode D2 of the auxiliary thin-film transistor TFT' may be connected to the second pixel electrode 121' of the auxiliary organic light-emitting diode OLED'.

The first semiconductor layer A1 and the second semiconductor layer A2 may be located on the buffer layer 111, and may each include polysilicon. For example, each of the first semiconductor layer A1 and the second semiconductor layer A2 may include polysilicon obtained by a laser crystallization process that is a process of crystallizing amorphous silicon using a laser. In an exemplary embodiment of the present disclosure, each of the first semiconductor layer A1 and the second semiconductor layer A2 may include an oxide of at least one material selected from, for example, indium (In), gallium (Ga), stannum (Sn), zirconium (Zr), vanadium (V), hafnium (Hf), cadmium (Cd), germanium (Ge), chromium (Cr), titanium (Ti), and zinc (Zn). Each of the first semiconductor layer A1 and the second semiconductor layer A2 may include a channel region, and a source region and a drain region doped with impurities.

Each of the first semiconductor layer A1 and the second semiconductor layer A2 of the display apparatus 1 may be formed by a laser crystallization process that is a process of crystallizing amorphous silicon into polysilicon. However, when a laser crystallization process is performed on amorphous silicon located on a substrate including transparent polyimide, the uniformity of crystallized polysilicon may be reduced due to hydrogen emitted by the transparent polyimide may reach the first semiconductor layer A1 and the second semiconductor layer A2 of the display apparatus 1.

According to the present disclosure, because a high-density barrier layer is located on a substrate including transparent polyimide, the high-density barrier layer may prevent hydrogen emitted by the substrate including the transparent polyimide from reaching a semiconductor layer, and thus even when the substrate includes the transparent polyimide, a laser crystallization process may be stably performed.

A barrier layer 105 may be located between the first substrate 100 and the buffer layer 111. In an exemplary embodiment of the present disclosure, the barrier layer 105 may be directly located on the first substrate 100. The barrier layer 105 may have a thickness ranging from about 200 Å to about 600 Å from a top surface of the first substrate 100, for example, ranging from about 300 Å to about 600 Å from the top surface of the first substrate 100, or for example, ranging from about 200 Å to about 500 Å from the top surface of the first substrate 100. For example, when the barrier layer 105 is thin, the barrier layer 105 may fail to prevent hydrogen emitted from transparent polyimide from reaching a semiconductor layer, and when the barrier layer 105 is thick, a transmittance of the transmission area TA may be reduced. For example, in an exemplary embodiment of the present disclosure, the barrier layer 105 may have a thickness ranging from about 300 Å to about 500 Å from the top surface of the first substrate 100. In an exemplary embodiment of the present disclosure, a metal layer, an inorganic insulating layer, or an organic insulating layer may be additionally located between the first substrate 100 and the barrier layer 105.

The barrier layer 105 may include, for example, silicon nitride ($SiN_x$), silicon nitride ($Si_3N_4$), aluminum oxide ($Al_2O_3$), or zirconium oxide ($Zr_2O_3$), and may have a density ranging from about 2 g/cm$^3$ to about 6 g/cm$^3$. In an exemplary embodiment of the present disclosure, the silicon nitride ($SiN_x$) included in the barrier layer 105 may be a nitrogen rich silicon nitride ($SiN_x$) with nitrogen to silicon ratio (N/Si) greater than 4/3. That is, x in the formula $SiN_x$ of the nitrogen rich silicon nitride included in the barrier layer 105 is greater than 4/3. The silicon nitride ($SiN_x$) or silicon nitride ($Si_3N_4$) included in the barrier layer 105 may have low hydrogen content or no hydrogen content. In an exemplary embodiment of the present disclosure, the barrier layer 105 may include aluminum oxide ($Al_2O_3$) or zirconium oxide ($Zr_2O_3$), and may have a density ranging from about 2 g/cm$^3$ to about 6 g/cm$^3$.

In the display apparatus 1 according to an exemplary embodiment of the present disclosure, the barrier layer 105 may include silicon nitride ($SiN_x$) formed by a plasma-enhanced chemical vapor deposition (PECVD) process using at least one gas selected from ammonia ($NH_3$), nitrogen ($N_2$), and silane ($SiH_4$), may include silicon nitride ($Si_3N_4$) formed by a reaction between ammonia ($NH_3$) and silane ($SiH_4$) at a temperature of 1000° C. or higher, or may include one material from among aluminum oxide ($Al_2O_3$) and zirconium oxide ($Zr_2O_3$) formed by an atomic layer deposition (ALD) process. The barrier layer 105 may have a single or multi-layer structure including the above materials. When the barrier layer 105 has a multi-layer structure, multiple layers may be continuously formed, or another layer may be located therebetween. For example, an inorganic insulating layer may be additionally located between barrier layers, or barrier layers and inorganic insulating layers may be alternately arranged.

The barrier layer 105 may be located between the first substrate 100 and the main thin-film transistor TFT to prevent hydrogen emitted from the first substrate 100 from reaching the first semiconductor layer A1, and may be located between the first substrate 100 and the auxiliary thin-film transistor TFT' to prevent hydrogen emitted from the first substrate 100 from reaching the second semiconductor layer A2. The barrier layer 105 according to an exemplary embodiment of the present disclosure may have high density in a range from about 2 g/cm$^3$ to about 6 g/cm$^3$, such that hydrogen emitted from the first substrate 100 may be blocked by the barrier layer 105 having high density, and prevented from penetrating through the barrier layer 105 having high density to reach the first semiconductor layer A1 of the main thin-film transistor TFT and the second semiconductor layer A2 of the auxiliary thin-film transistor TFT'. In an exemplary embodiment of the present disclosure, an inorganic insulating layer or an organic insulating layer may be further located between the first substrate 100 and the barrier layer 105 and between the barrier layer 105 and the main and auxiliary thin-film transistors TFT and TFT'.

The first insulating layer 112 may be provided to cover the first semiconductor layer A1 and the second semiconductor layer A2. The first insulating layer 112 may include an inorganic insulating layer such as, for example, silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). In an exemplary embodiment of the present disclosure, the silicon nitride ($SiN_x$) included in the first insulating layer 112 may be a nitrogen rich silicon nitride ($SiN_x$) with nitrogen to silicon ratio (N/Si) greater than 4/3. That is, x in the formula $SiN_x$ of the nitrogen rich silicon nitride included in the first insulating layer 112 is greater than 4/3. The first insulating layer 112 may have a single or multi-layer structure including the above inorganic insulating material or materials.

A first gate electrode G1 and a second gate electrode G2 may be located on the first insulating layer 112 to respectively overlap the first semiconductor layer A1 and the second semiconductor layer A2. Each of the first gate electrode G1 and the second gate electrode G2 may include, for example, molybdenum (Mo), aluminum (Al), copper (Cu), or titanium (Ti), and may have a single or multi-layer structure. In an exemplary embodiment of the present disclosure, each of the first gate electrode G1 and the second gate electrode G2 may have a single-layer structure including molybdenum (Mo).

The second insulating layer 113 may be provided to cover the first gate electrode G1 and the second gate electrode G2. The second insulating layer 113 may include an inorganic insulating material such as, for example, silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The second insulating layer 113 may be a single or multi-layer structure including the above inorganic insulating material or materials.

A first upper electrode CE2 of the main storage capacitor Cst and a second upper electrode CE2' of the auxiliary storage capacitor Cst' may be located on the second insulating layer 113.

In the main display area MDA, the first upper electrode CE2 may overlap the first gate electrode G1 located under the first upper electrode CE2. The first gate electrode G1 and the first upper electrode CE2 overlapping each other with the second insulating layer 113 interposed therebetween may constitute the main storage capacitor Cst. The first gate electrode G1 may be integrally formed with a first lower electrode CE1 of the main storage capacitor Cst. In an exemplary embodiment of the present disclosure, the main storage capacitor Cst may not overlap the main thin-film transistor TFT, and the first lower electrode CE1 of the main storage capacitor Cst may be an element separate from the first gate electrode G1 of the main thin-film transistor TFT.

In the component area CA, the second upper electrode CE2' may overlap the second gate electrode G2 located under the second upper electrode CE2'. The second gate electrode G2 and the second upper electrode CE2' overlapping each other with the second insulating layer 113 interposed therebetween may constitute the auxiliary storage capacitor Cst'. The second gate electrode G2 may be integrally provided with the second lower electrode CE1' of the auxiliary storage capacitor Cst'. In an exemplary embodiment of the present disclosure, the auxiliary storage capacitor Cst' may not overlap the auxiliary thin-film transistor TFT', and the second lower electrode CE1' of the auxiliary storage capacitor Cst' may be an element separate from the second gate electrode G2 of the auxiliary thin-film transistor TFT'.

Each of the first upper electrode CE2 and the second upper electrode CE2' may include, for example, aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single or multi-layer structure including the above material or materials.

The third insulating layer 115 may be formed to cover the first upper electrode CE2 and the second upper electrode CE2'. The third insulating layer 115 may include, for example, silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The third insulating layer 115 may have a single or multi-layer structure including the above inorganic insulating material or materials.

The first insulating layer 112, the second insulating layer 113, and the third insulating layer 115 may be collectively referred to as an inorganic insulating layer IL, and the inorganic insulating layer IL may have a first hole H1 corresponding to the transmission area TA. A part of a top surface of the first substrate 100 or the buffer layer 111 may be exposed through the first hole H1. The first hole H1 may be formed when an opening of the second insulating layer 113, and an opening of the third insulating layer 115 formed to correspond to the transmission area TA overlap each other, or the first hole H1 may be formed when an opening of the first insulating layer 112, an opening of the second insulating layer 113, and an opening of the third insulating layer 115 formed to correspond to the transmission area TA overlap one another. The openings may be individually formed by separate processes or may be simultaneously formed by the same process. When the openings are formed by separate processes, an inner surface of the first hole H1 may not be smooth and may have a stepped portion.

Unlike described above, the inorganic insulating layer IL may have a groove other than the first hole H1 through which the buffer layer 111 is exposed. Alternatively, the inorganic insulating layer IL may have neither the first hole H1 nor the groove corresponding to the transmission area TA. Because the inorganic insulating layer IL generally includes an inorganic insulating material having an excellent light transmittance, the inorganic insulating layer IL may have a sufficient transmittance even without a hole or a groove corresponding to the transmission area TA, and thus the component 40 (see FIG. 2) may transmit/receive a sufficient amount of light. Alternatively, the first hole H1 may be formed in the inorganic insulating layer IL, but the first hole H1 may not be deep enough to expose the buffer layer 111.

The first and second source electrodes S1 and S2 and the first and second drain electrodes D1 and D2 may be located on the third insulating layer 115. Each of the first and second source electrodes S1 and S2 and the first and second drain electrodes D1 and D2 may include a conductive material including, for example, molybdenum (Mo), aluminum (Al), copper (Cu), or titanium (Ti), and may have a single or multi-layer structure including the conductive material or materials. For example, each of the first and second source electrodes S1 and S2 and the first and second drain electrodes D1 and D2 may have a multi-layer structure, for example, a tri-layer structure, including Ti/Al/Ti.

The planarization layer 117 may be located to cover the first and second source electrodes S1 and S2 and the first and second drain electrodes D1 and D2. The planarization layer 117 may have a flat top surface so that a first pixel electrode 121 and a second pixel electrode 121' located on the planarization layer 117 are flat.

The planarization layer 117 may include an organic material or an inorganic material, and may have a single or multi-layer structure. The planarization layer 117 may include a first planarization layer 117a and a second planarization layer 117b. Accordingly, because a conductive pattern such as a wiring may be formed between the first planarization layer 117a and the second planarization layer 117b, high integration may be achieved.

The planarization layer 117 may include, for example, benzocyclobutene (BCB), polyimide (PI), hexamethyldisiloxane (HMDSO), a general-purpose polymer such as polymethyl methacrylate (PMMA) or polystyrene (PS), a polymer derivative having a phenol-based group, an acrylic polymer, an imide-based polymer, an aryl ether-based polymer, an amide-based polymer, a fluorinated polymer, a p-xylene-based polymer, or a vinyl alcohol-based polymer. The planarization layer 117 may include an inorganic insulating material such as, for example, silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). When the planarization layer 117 is to be formed, a layer may be formed and then a chemical mechanical polishing (CMP) process may be performed on a top surface of the layer to provide a flat top surface. When the planarization layer 117 is formed through a spin coating process, a flat top surface may be obtained through the coating and baking process without performing a chemical mechanical polishing (CMP) process. Alternatively, when the planarization layer 117 is to be formed, a layer may be formed and then an etch back process may be performed on a top surface of the layer to provide a flat top surface.

The first planarization layer 117a may be located to cover the main and auxiliary pixel circuits PC and PC'. The second planarization layer 117b may be located on the first planarization layer 117a, and may have a flat top surface, so that the first and second pixel electrodes 121 and 121' located on the second planarization layer 117b may be flat.

The main and auxiliary organic light-emitting diodes OLED and OLED' may be located on the second planarization layer 117b. The first and second pixel electrodes 121 and 121' of the main and auxiliary organic light-emitting diodes OLED and OLED' located on the second planarization layer 117b may be connected to the main and auxiliary pixel circuits PC and PC' through connection electrodes CM and CM' located on the first planarization layer 117a.

The connection electrodes CM and CM' may be located between the first planarization layer 117a and the second planarization layer 117b. For example, the connection electrodes CM and CM' may be formed in the second planarization layer 117b and located on the first planarization layer 117a. Each of the connection electrodes CM and CM' may include a conductive material including, for example, molybdenum (Mo), aluminum (Al), copper (Cu), or titanium (Ti), and may have a single or multi-layer structure including the conductive material or materials. For example, each of the connection electrodes CM and CM' may have a multi-layer structure, for example, a tri-layer structure, including Ti/Al/Ti.

The planarization layer 117 may have a second hole H2 corresponding to the transmission area TA. The second hole H2 may overlap the first hole H1. The second hole H2 is larger than the first hole H1 in FIG. 9. In an exemplary embodiment of the present disclosure, the planarization layer 117 may be provided to cover an edge of the first hole H1 of the inorganic insulating layer IL, so that the area of the second hole H2 is less than the area of the first hole H1. In an exemplary embodiment of the present disclosure, the second hole H2 may have a shape and size about the same as those of the first hole H1. In an exemplary embodiment of the present disclosure, the planarization layer 117 in the transmission area TA may not be removed.

The planarization layer 117 may have a via-hole through which one of the first source electrode S1 and the first drain electrode D1 of the main thin-film transistor TFT is exposed, and the first pixel electrode 121 may contact the first source electrode S1 or the first drain electrode D1 through the via-hole to be electrically connected to the main thin-film transistor TFT. Also, the planarization layer 117 may have a via-hole through which one of the second source electrode S2 and the second drain electrode D2 of the auxiliary thin-film transistor TFT' is exposed, and the second pixel electrode 121' may contact the second source electrode S2 or the second drain electrode D2 through the via-hole to be electrically connected to the auxiliary thin-film transistor TFT'.

Each of the first pixel electrode 121 and the second pixel electrode 121' may include a conductive oxide such as, for example, indium tin oxide (ITO), indium zinc oxide (IZO), zinc oxide (ZnO), indium oxide ($In_2O_3$), indium gallium oxide (IGO), or aluminum zinc oxide (AZO). Each of the first pixel electrode 121 and the second pixel electrode 121' may include a reflective film including, for example, silver (Ag), magnesium (Mg), aluminum (Al), platinum (Pt), palladium (Pd), gold (Au), nickel (Ni), neodymium (Nd), iridium (Ir), chromium (Cr), or a compound thereof. For example, each of the first pixel electrode 121 and the second pixel electrode 121' may include films formed of, for example, indium tin oxide (ITO), indium zinc oxide (IZO), zinc oxide (ZnO), or indium oxide ($In_2O_3$) located over/under the reflective film. In this case, each of the first pixel electrode 121 and the second pixel electrode 121' may have a stacked structure including, for example, ITO/Ag/ITO.

A pixel-defining layer 119 may be located on the planarization layer 117 to cover an edge of each of the first pixel electrode 121 and the second pixel electrode 121', and may have a first opening OP1 and a second opening OP2 through which central portions of the first pixel electrode 121 and the second pixel electrode 121' are exposed. Sizes and shapes of emission areas of the main and auxiliary organic light-emitting diodes OLED and OLED', that is, the main and auxiliary sub-pixels Pm and Pa, are defined by the first opening OP1 and the second opening OP2, respectively.

The pixel-defining layer 119 may prevent an arc or the like from occurring between each of the first and second pixel electrodes 121 and 121' and a counter electrode 123 on the edge of each of the first and second pixel electrodes 121 and 121' by increasing a distance between the edge of each the first and second pixel electrodes 121 and 121' and the counter electrode 123 located over the first and second pixel electrodes 121 and 121'. The pixel-defining layer 119 may be formed of an organic insulating material such as, for example, polyimide, polyamide, acrylic resin, benzocyclobutene, hexamethyldisiloxane (HMDSO), or phenolic resin by a spin coating process or the like. Alternatively, pixel-defining layer 119 may include an inorganic insulating material such as, for example, silicon oxide ($SiO_2$), silicon nitride ($SiN_x$), or silicon oxynitride (SiON). Alternatively, the pixel-defining layer 119 may include an organic insulating material and an inorganic insulating material.

The pixel-defining layer 119 may have a third hole H3 located in the transmission area TA. The third hole H3 may overlap the first hole H1 and the second hole H2. A light transmittance of the transmission area TA may be enhanced due to the first hole H1 through the third hole H3. A part of the counter electrode 123 described above may be located inside the third hole H3 through a fifth hole H5. In an exemplary embodiment of the present disclosure, the pixel-defining layer 119 in the transmission area TA may not be removed.

A first emission layer 122b and a second emission layer 122b' formed to respectively correspond to the first pixel electrode 121 and the second pixel electrode 121' are located in the first opening OP1 and the second opening OP2 of the pixel-defining layer 119. Each of the first emission layer 122b and the second emission layer 122b' may include a high molecular weight material or a low molecular weight material, and may emit red, green, blue, or white light. In an exemplary embodiment of the present disclosure, the first emission layer 122b and the second emission layer 122b' may each include a fluorescent material or a phosphorescent material.

An organic functional layer 122e may be located over and/or under the first emission layer 122b and the second emission layer 122b'. The organic functional layer 122e may include a first functional layer 122a and/or a second functional layer 122c. The first functional layer 122a or the second functional layer 122c may be omitted.

The first functional layer 122a may be located under the first emission layer 122b and the second emission layer 122b', and may have a single or multi-layer structure including an organic material or organic materials. The first functional layer 122a may be a hole transport layer (HTL) having a single-layer structure. Alternatively, the first functional layer 122a may include a hole injection layer (HIL) and a hole transport layer (HTL). The first functional layer 122a may be integrally formed to correspond to the main and auxiliary organic light-emitting diodes OLED and OLED' included in the main display area MDA and the component area CA.

The second functional layer 122c may be located over the first emission layer 122b and the second emission layer 122b', and may have a single or multi-layer structure including an organic material or organic materials. The second functional layer 122c may include an electron transport layer (ETL) and/or an electron injection layer (EIL). The second functional layer 122c may be integrally formed to correspond to the main and auxiliary organic light-emitting diodes OLED and OLED' included in the main display area MDA and the component area CA. Thus, the first emission layer 122b and the second emission layer 122b' may each generate a color light corresponding to each of the main sub-pixel Pm and the auxiliary sub-pixel Pa, and may be interposed between the hole transport layer (HTL) and the electron transport layer (ETL).

The counter electrode 123 is located over the second functional layer 122c, and may include a conductive material having a low work function. For example, the counter electrode 123 may include a semi-transparent layer including, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the counter electrode 123 may further include a layer formed of indium tin oxide (ITO), indium zinc oxide (IZO), zinc oxide (ZnO), or indium oxide ($In_2O_3$) on the semi-transparent layer including the above material. The counter electrode 123 may be integrally formed to correspond to the main and auxiliary organic light-emitting diodes OLED and OLED' included in the main display area MDA and the component area CA.

Layers from the first pixel electrode 121 to the counter electrode 123 formed in the main display area MDA may constitute the main organic light-emitting diode OLED. Layers from the second pixel electrode 121' to the counter electrode 123 formed in the component area CA may constitute the auxiliary light-emitting diode OLED'. For example, the auxiliary display element (e.g., auxiliary organic light-emitting diode OLED') may include the counter electrode 123, the second pixel electrode 121', and any other elements interposed therebetween.

An upper layer 150 including an organic material may be formed on the counter electrode 123. The upper layer 150 may be a layer for protecting the counter electrode 123 and enhancing light extraction efficiency. The upper layer 150 may include an organic material having a refractive index higher than that of the counter electrode 123. Alternatively, the upper layer 150 may be provided by stacking layers having different refractive indexes. For example, the upper layer 150 may be provided by stacking a high-refractive index layer, a low-refractive index layer, and a high-refractive index layer. In this case, a refractive index of the high-refractive index layer may be equal to or greater than 1.7, and a refractive index of the low-refractive index layer may be equal to or less than 1.3. The upper layer 150 may additionally include lithium fluoride (LiF). Alternatively, the upper layer 150 may additionally include an inorganic insulating material such as silicon oxide ($SiO_2$) or silicon nitride ($SiN_x$). In an exemplary embodiment of the present disclosure, the upper layer 150 may be omitted.

The first functional layer 122a, the second functional layer 122c, the counter electrode 123, and the upper layer 150 may have a transmission hole (TAH) corresponding to the transmission area TA. That is, the first functional layer 122a, the second functional layer 122c, the counter electrode 123, and the upper layer 150 may respectively have openings corresponding to the transmission area TA. The areas of the openings may be substantially the same. For example, the area of the opening of the counter electrode 123 may be substantially the same as the area of the transmission hole TAH.

When the transmission hole TAH corresponds to the transmission area TA, it may mean that the transmission hole TAH overlaps the transmission area TA. In this case, the area of the transmission hole TAH may be less than the area of the first hole H1 formed in the inorganic insulating layer IL. To this end, a width Wt of the transmission hole TAH is less than a width of the first hole H1 in FIG. 9. The area of the transmission hole TAH may be defined as the area of a narrowest opening from among openings constituting the transmission hole TAH. The area of the first hole H1 may also be defined as the area of a narrowest opening from among openings constituting the first hole H1.

Due to the transmission hole TAH, a part of the counter electrode 123 may not exist in the transmission area TA, and thus a light transmittance of the transmission area TA may be significantly increased. The counter electrode 123 having the transmission hole TAH may be formed by any of various methods. In an exemplary embodiment of the present disclosure, the counter electrode 123 having the transmission hole TAH may be formed by forming a material used to form the counter electrode 123 on an entire surface of a substrate and removing a portion corresponding to the transmission area TA using a laser lift-off process. In an exemplary embodiment of the present disclosure, the counter electrode 123 having the transmission hole TAH may be formed by a metal self-patterning (MSP) process. In an exemplary embodiment of the present disclosure, the counter electrode 123 having the transmission hole TAH may be formed by a method of depositing the counter electrode 123 using a fine metal mask (FMM).

The main organic light-emitting diode OLED of the main display area MDA and the auxiliary organic light-emitting diode OLED' of the component area CA may be covered by the thin-film encapsulation layer TFE. The thin-film encapsulation layer TFE may include at least one organic encapsulation layer and at least one inorganic encapsulation layer. For example, as shown in FIG. 9, the thin-film encapsulation layer TFE may include the first inorganic encapsulation layer 310, the second inorganic encapsulation layer 330, and the organic encapsulation layer 320 formed between the first inorganic encapsulation layer 310 and the second inorganic encapsulation layer 330. In an exemplary embodiment of the present disclosure, the number of organic encapsulation layers and the number of inorganic encapsulation layers and an order of stacking organic encapsulation layers and inorganic encapsulation layers may be variously changed.

Figure 10:
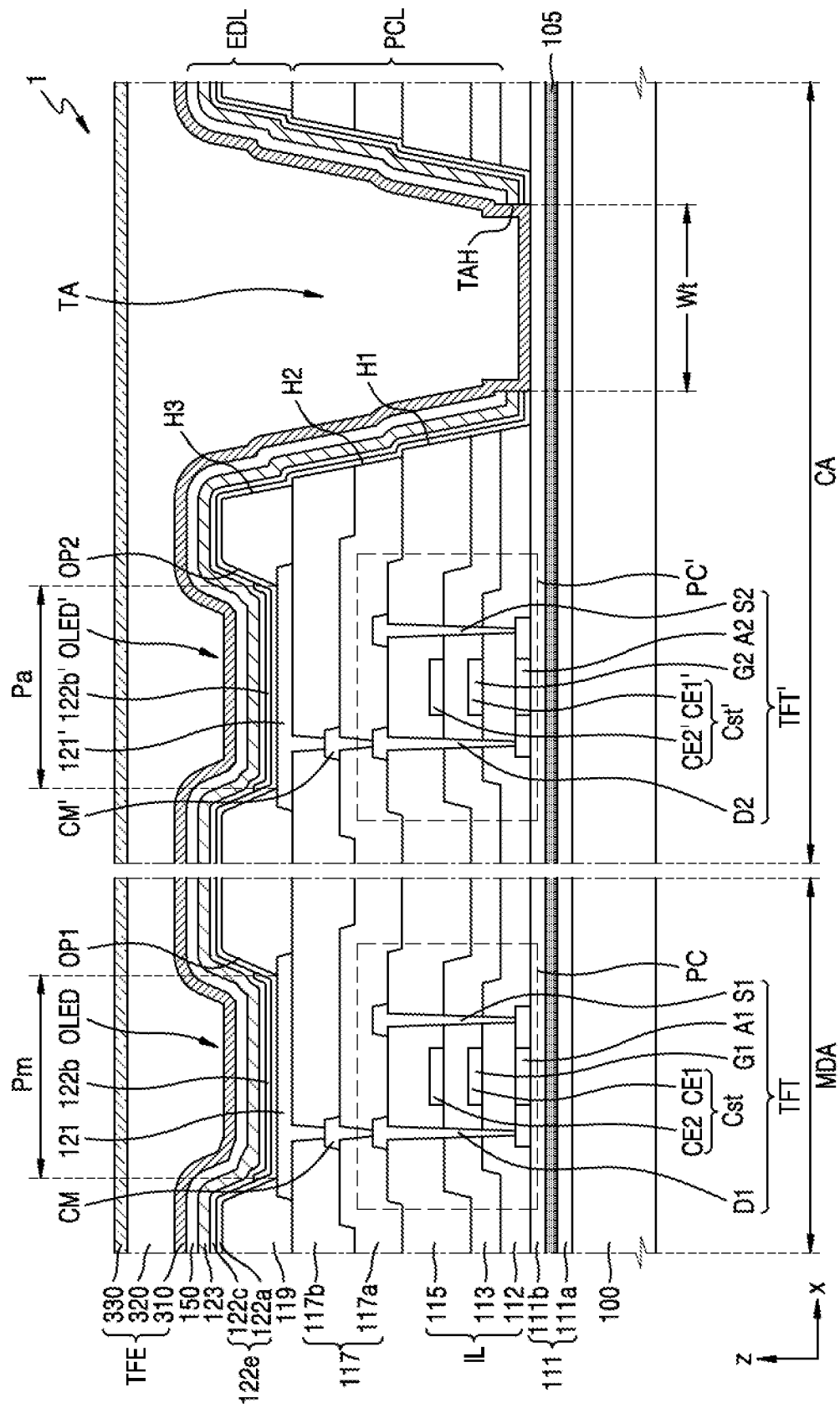
FIG. 10 is a cross-sectional view illustrating a display apparatus according to an exemplary embodiment of the present disclosure.

FIG. 10 is a cross-sectional view illustrating a display apparatus according to an exemplary embodiment of the present disclosure. The exemplary embodiment of FIG. 10 is different from the exemplary embodiment of FIG. 9 in that a buffer layer includes a first buffer layer and a second buffer layer and a barrier layer is located between the first buffer layer and the second buffer layer. The same elements of FIG. 10 as those of FIG. 9 will not be described, and the following will focus on a difference between FIGS. 9 and 10.

Referring to FIG. 10, the buffer layer 111 may include a first buffer layer 111a and a second buffer layer 111b. The barrier layer 105 may be located between the first buffer layer 111a and the second buffer layer 111b. For example, the first buffer layer 111a may be directly located on a top surface of the first substrate 100, the barrier layer 105 may be directly located on a top surface of the first buffer layer 111a, and the second buffer layer 111b may be directly located on a top surface of the barrier layer 105. In an exemplary embodiment of the present disclosure, a metal layer, an inorganic insulating layer, or an organic insulating layer may be additionally located between the first substrate 100 and the first buffer layer 111a, between the barrier layer 105 and the first buffer layer 111a, and between the barrier layer 105 and the second buffer layer 111b.

The first buffer layer 111a may have a thickness ranging from about 3000 Å to about 7000 Å from the top surface of the first substrate 100, for example, ranging from about 4000 Å to about 7000 Å from the top surface of the first substrate 100, or for example, ranging from about 3000 Å to about 6000 Å from the top surface of the first substrate 100. In an exemplary embodiment of the present disclosure, the first buffer layer 111a may have a thickness ranging from about 4000 Å to about 6000 Å from the top surface of the first substrate 100. In an exemplary embodiment of the present disclosure, a metal layer, an inorganic insulating layer, or an organic insulating layer may be additionally located between the first substrate 100 and the first buffer layer 111a.

The barrier layer 105 may have a thickness ranging from about 200 Å to about 600 Å from the top surface of the first buffer layer 111a, for example, ranging from about 300 Å to about 600 Å from the top surface of the first buffer layer 111a, or for example, ranging from about 200 Å to about 500 Å from the top surface of the first buffer layer 111a. For example, when the barrier layer 105 is thin, the barrier layer 105 may fail to prevent hydrogen emitted from transparent polyimide from reaching a semiconductor layer, and when the barrier layer 105 is thick, a transmittance of the transmission area TA may be reduced. Accordingly, in an exemplary embodiment of the present disclosure, the barrier layer 105 may have a thickness ranging from about 300 Å to about 500 Å from the top surface of the first buffer layer 111a. In an exemplary embodiment of the present disclosure, a metal layer, an inorganic insulating layer, or an organic insulating layer may be additionally located between the first buffer layer 111a and the barrier layer 105.

The barrier layer 105 according to an exemplary embodiment of the present disclosure may have high density in a range from about 2 $g/cm^3$ to about 6 $g/cm^3$, such that hydrogen emitted from the first substrate 100 may be blocked by the barrier layer 105 having high density. Because the barrier layer 105 is located over the first substrate 100, the barrier layer 105 may prevent hydrogen emitted from the first substrate 100 including transparent polyimide from reaching a semiconductor layer, thereby making it possible to stably perform excimer laser annealing (ELA).

The second buffer layer 111b may have a thickness ranging from about 1000 Å to about 5000 Å from the top surface of the barrier layer 105, for example, ranging from about 2000 Å to about 5000 Å from the top surface of the barrier layer 105, or for example, ranging from about 1000 Å to about 4000 Å from the top surface of the barrier layer 105. In an exemplary embodiment of the present disclosure, the second buffer layer 111b may have a thickness ranging from about 2000 Å to about 4000 Å from the top surface of the barrier layer 105. In an exemplary embodiment of the present disclosure, a metal layer, an inorganic insulating layer, or an organic insulating layer may be additionally located between the barrier layer 105 and the second buffer layer 111b.

Figure 11:
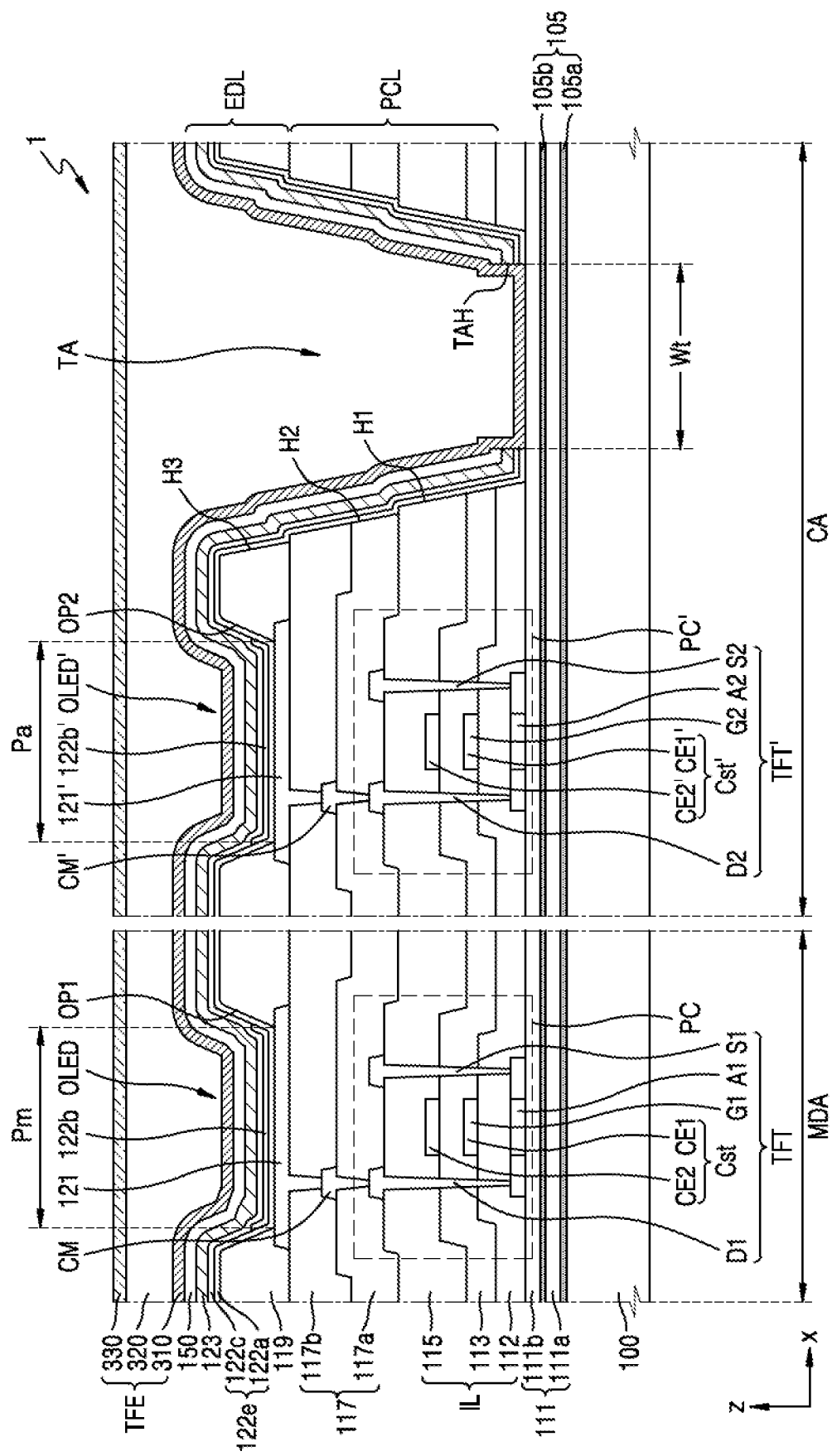
FIG. 11 is a cross-sectional view illustrating a display apparatus according to an exemplary embodiment of the present disclosure.

FIG. 11 is a cross-sectional view illustrating a display apparatus according to an exemplary embodiment of the present disclosure. The exemplary embodiment of FIG. 11 is different from the exemplary embodiment of FIG. 9 in that a buffer layer includes a first buffer layer and a second buffer layer and a barrier layer includes a first barrier layer and a second barrier layer. The same elements of FIG. 11 as those of FIG. 9 will not be described, and the following will focus on a difference between FIGS. 9 and 11.

Referring to FIG. 11, the buffer layer 111 may include the first buffer layer 111a and the second buffer layer 111b, and the barrier layer 105 may include a first barrier layer 105a and a second barrier layer 105b.

The first barrier layer 105a may be located between the first substrate 100 and the first buffer layer 111a, and the second barrier layer 105b may be located between the first buffer layer 111a and the second buffer layer 111b. In more detail, the first barrier layer 105a may be directly located on a top surface of the first substrate 100, the first buffer layer 111a may be directly located on a top surface of the first barrier layer 105a, the second barrier layer 105b may be directly located on a top surface of the first buffer layer 111a, and the second buffer layer 111b may be directly located on a top surface of the second barrier layer 105b. In an exemplary embodiment of the present disclosure, a metal layer, an inorganic insulating layer, or an organic insulating layer may be additionally located between the first substrate 100 and the first barrier layer 105a, between the first barrier layer 105a and the first buffer layer 111a, between the first buffer layer 111a and the second barrier layer 105b, and between the second barrier layer 105b and the second buffer layer 111b.

The first barrier layer 105a may have a thickness ranging from about 100 Å to about 300 Å from the top surface of the first substrate 100, for example, ranging from about 150 Å to about 300 Å from the top surface of the first substrate 100, or for example, ranging from about 100 Å to about 250 Å from the top surface of the first substrate 100. In an exemplary embodiment of the present disclosure, the barrier layer 105 may have a thickness ranging from about 150 Å to about 250 Å from the top surface of the first substrate 100. In an exemplary embodiment of the present disclosure, a metal layer, an inorganic insulating layer, or an organic insulating layer may be additionally located between the first substrate 100 and the first barrier layer 105a.

The first buffer layer 111a may have a thickness ranging from about 2000 Å to about 6000 Å from the top surface of the first barrier layer 105a, for example, ranging from about 2000 Å to about 5000 Å from the top surface of the first barrier layer 105*a*, or for example, ranging from about 3000 Å to about 6000 Å from the top surface of the first barrier layer 105*a*. In an exemplary embodiment of the present disclosure, the first buffer layer 111*a* may have a thickness ranging from about 3000 Å to about 5000 Å from the top surface of the first barrier layer 105*a*. In an exemplary embodiment of the present disclosure, a metal layer, an inorganic insulating layer, or an organic insulating layer may be additionally located between the first barrier layer 105*a* and the first buffer layer 111*a*.

The second barrier layer 105*b* may have a thickness ranging from about 100 Å to about 300 Å from the top surface of the first buffer layer 111*a*, for example, ranging from about 150 Å to about 300 Å from the top surface of the first buffer layer 111*a*, or for example, ranging from about 100 Å to about 250 Å from the top surface of the first buffer layer 111*a*. In an exemplary embodiment of the present disclosure, the second barrier layer 105*b* may have a thickness ranging from about 150 Å to about 250 Å from the top surface of the first buffer layer 111*a*. In an exemplary embodiment of the present disclosure, a metal layer, an inorganic insulating layer, or an organic insulating layer may be additionally located between the first buffer layer 111*a* and the second barrier layer 105*b*.

A sum of thicknesses of the first barrier layer 105*a* and the second barrier layer 105*b* may range from about 300 Å to about 500 Å. In an exemplary embodiment of the present disclosure, thicknesses of the first barrier layer 105*a* and the second barrier layer 105*b* may be the same. In an exemplary embodiment of the present disclosure, thicknesses of the first barrier layer 105*a* and the second barrier layer 105*b* may be different from each other.

The first barrier layer 105*a* and the second barrier layer 105*b* according to an exemplary embodiment of the present disclosure may each have high density in a range from about 2 g/cm$^3$ to about 6 g/cm$^3$, such that hydrogen emitted from the first substrate 100 may be blocked by the first barrier layer 105*a* and the second barrier layer 105*b* having high density. Because the first barrier layer 105*a* and the second barrier layer 105*b* are located on the first substrate 100, the first barrier layer 105*a* and the second barrier layer 105*b* may prevent hydrogen emitted from the first substrate 100 including transparent polyimide from reaching a semiconductor layer, thereby making it possible to stably perform a excimer laser annealing (ELA).

The second buffer layer 111*b* may have a thickness ranging from about 2000 Å to about 6000 Å from the top surface of the second barrier layer 105*b*, for example, ranging from about 2000 Å to about 5000 Å from the top surface of the second barrier layer 105*b*, or for example, ranging from about 3000 Å to about 6000 Å from the top surface of the second barrier layer 105*b*. In an exemplary embodiment of the present disclosure, the second buffer layer 111*b* may have a thickness ranging from about 3000 Å to about 5000 Å from the top surface of the second barrier layer 105*b*. In an exemplary embodiment of the present disclosure, a metal layer, an inorganic insulating layer, or an organic insulating layer may be additionally located between the second barrier layer 105*b* and the second buffer layer 111*b*.

In an exemplary embodiment of the present disclosure, thicknesses of the first buffer layer 111*a* and the second buffer layer 111*b* may be the same. In an exemplary embodiment of the present disclosure, thicknesses of the first buffer layer 111*a* and the second buffer layer 111*b* may be different from each other. That is, the first buffer layer 111*a* may be thicker than the second buffer layer 111*b*, or may be thinner than the second buffer layer 111*b*.

Figure 12:
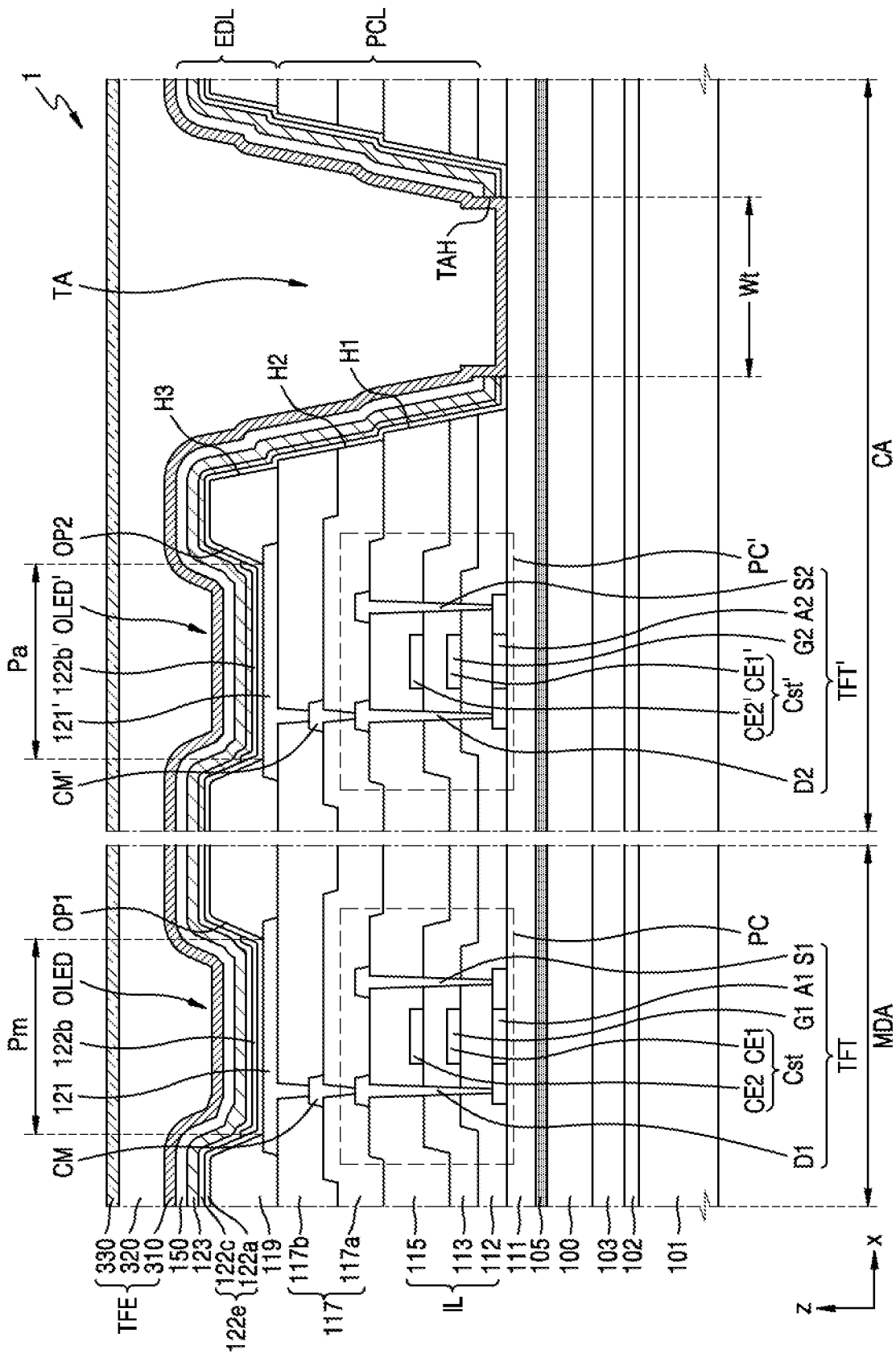
FIG. 12 is a cross-sectional view illustrating a display apparatus according to an exemplary embodiment of the present disclosure.

FIG. 12 is a cross-sectional view illustrating a display apparatus according to an exemplary embodiment of the present disclosure. The exemplary embodiment of FIG. 12 is different from the exemplary embodiment of FIG. 9 in that a second substrate, a first inorganic layer, and a second inorganic layer are further located under a first substrate. The same elements of FIG. 12 as those of FIG. 9 will not be described, and the following will focus on a difference between FIGS. 9 and 12.

Referring to FIG. 12, the display apparatus 1 according to an exemplary embodiment of the present disclosure may further include a second substrate 101 located under the first substrate 100, a first inorganic layer 102 located on the second substrate 101, and a second inorganic layer 103 located on the first inorganic layer 102.

The barrier layer 105 according to an exemplary embodiment of the present disclosure may have high density in a range from about 2 g/cm$^3$ to about 6 g/cm$^3$, such that hydrogen emitted from the first substrate 100 and/or the second substrate 101 may be blocked by the barrier layer 105 having high density. Because the barrier layer 105 is located over the second substrate 101 and the first substrate 100, the barrier layer 105 may prevent hydrogen emitted from the first substrate 100 and the second substrate 101 including transparent polyimide from reaching a semiconductor layer, thereby making it possible to stably perform a laser crystallization process that is a process of crystallizing amorphous silicon into polysilicon.

The second substrate 101 may be formed of an insulating material such as, for example, glass, quartz, or a polymer resin. The polymer resin may be transparent, and may be provided such that at least a part of the first substrate 100 may be easily bent. The second substrate 101 may be a rigid substrate, or a flexible substrate that is bendable, foldable, or rollable. For example, the second substrate 101 may include transparent polyimide (PI). In an exemplary embodiment of the present disclosure, the second substrate 101 may be thicker than the first substrate 100. In an exemplary embodiment of the present disclosure, a thickness of the second substrate 101 may be the same as or less than a thickness of the first substrate 100.

The first inorganic layer 102 may be located between the second substrate 101 and the first substrate 100, and may be directly located on the second substrate 101. The first inorganic layer 102 may have a thickness ranging from about 3000 Å to about 7000 Å, for example, ranging from about 4000 Å to about 7000 Å, or for example, ranging from about 3000 Å to about 6000 Å. In an exemplary embodiment of the present disclosure, the first inorganic layer 102 may have a thickness ranging from about 4000 Å to about 6000 Å. In an exemplary embodiment of the present disclosure, a metal layer, an inorganic insulating layer, or an organic insulating layer may be additionally located between the second substrate 101 and the first inorganic layer 102.

The first inorganic layer 102 may include an inorganic insulating material such as, for example, silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). For example, the first inorganic layer 102 may include silicon oxide ($SiO_2$).

The second inorganic layer 103 may be located on the first inorganic layer 102. The second inorganic layer 103 may be directly located on the first inorganic layer 102. The second inorganic layer 103 may have a thickness ranging from about 800 Å to about 1200 Å, for example, ranging from about 800 Å to about 1100 Å, or for example, ranging from about 900 Å to about 1200 Å. In an exemplary embodiment of the present disclosure, the second inorganic layer 103 may have a thickness ranging from about 900 Å to about 1100 Å. In an exemplary embodiment of the present disclosure, a metal layer, an inorganic insulating layer, or an organic insulating layer may be additionally located between the first inorganic layer 102 and the second inorganic layer 103.

The second inorganic layer 103 may include an inorganic insulating material such as, for example, silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). For example, the second inorganic layer 103 may include silicon oxynitride (SiON).

Figure 13:
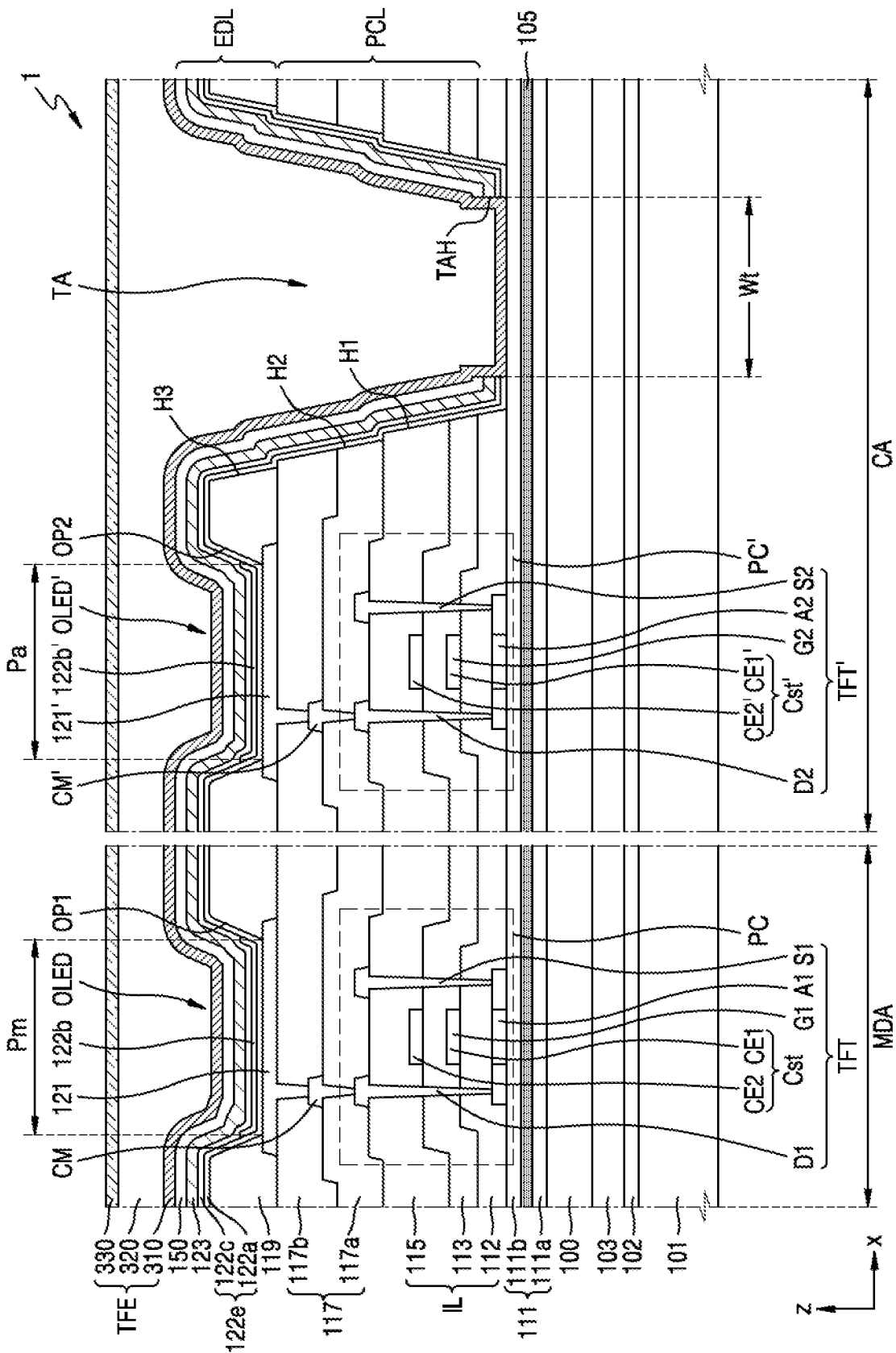
FIG. 13 is a cross-sectional view illustrating a display apparatus according to an exemplary embodiment of the present disclosure.

FIG. 13 is a cross-sectional view illustrating a display apparatus according to an exemplary embodiment of the present disclosure. The exemplary embodiment of FIG. 13 is different from the exemplary embodiment of FIG. 12 in that a buffer layer includes a first buffer layer and a second buffer layer. The same elements of FIG. 13 as those of FIG. 12 will not be described, and the following will focus on a difference between FIGS. 12 and 13.

Referring to FIG. 13, the display apparatus 1 according to an exemplary embodiment of the present disclosure may further include the second substrate 101 located under the first substrate 100, the first inorganic layer 102 located on the second substrate 101, and the second inorganic layer 103 located on the first inorganic layer 102, and the buffer layer 111 may include the first buffer layer 111a and the second buffer layer 111b.

The barrier layer 105 according to an exemplary embodiment of the present disclosure may have high density in a range from about 2 g/cm³ to about 6 g/cm³, such that hydrogen emitted from the first substrate 100 and/or the second substrate 101 may be blocked by the barrier layer 105 having high density. The barrier layer 105 may be located between the first buffer layer 111a and the second buffer layer 111b. Because the barrier layer 105 is located over the second substrate 101 and the first substrate 100, the barrier layer 105 may prevent hydrogen emitted from the first substrate 100 and the second substrate 101 including transparent polyimide from reaching a semiconductor layer, thereby making it possible to stably perform a laser crystallization process that is a process of crystallizing amorphous silicon into polysilicon.

In an exemplary embodiment of the present disclosure, the barrier layer 105 may be located between the first buffer layer 111a and the second buffer layer 111b, and an inorganic insulating layer or an organic insulating layer may be additionally located over or under the barrier layer 105.

Figure 14:
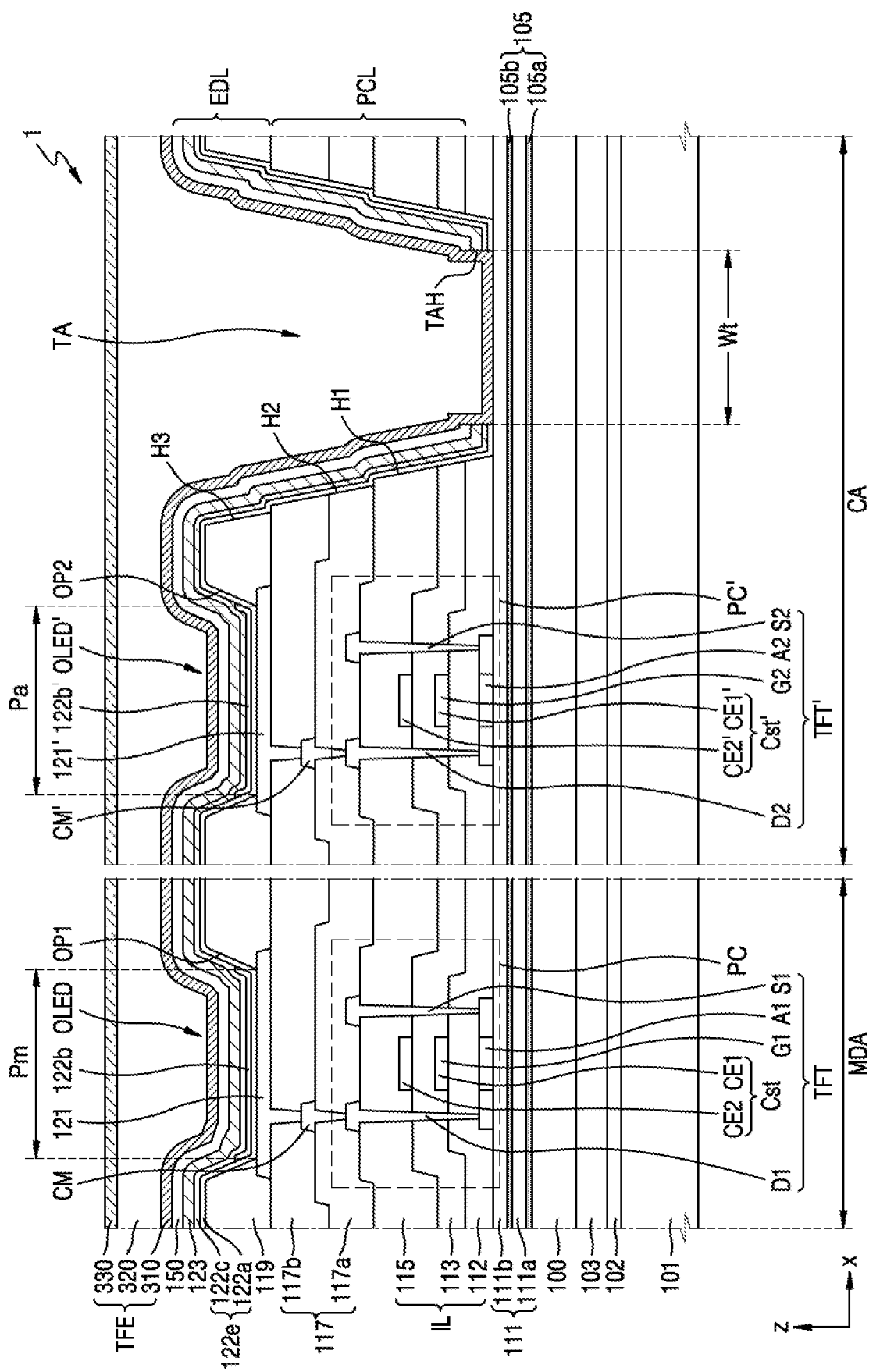
FIG. 14 is a cross-sectional view illustrating a display apparatus according to an exemplary embodiment of the present disclosure.

FIG. 14 is a cross-sectional view illustrating a display apparatus according to an exemplary embodiment of the present disclosure. The exemplary embodiment of FIG. 14 is different from the exemplary embodiment of FIG. 12 in that a buffer layer includes a first buffer layer and a second buffer layer, and a barrier layer includes a first barrier layer and a second barrier layer. The same elements of FIG. 14 as those of FIG. 12 will not be described, and the following will focus on a difference between FIGS. 12 and 14.

Referring to FIG. 14, the display apparatus 1 according to an exemplary embodiment of the present disclosure may further include the second substrate 101 located under the first substrate 100, the first inorganic layer 102 located on the second substrate 101, and the second inorganic layer 103 located on the first inorganic layer 102. The buffer layer 111 may include the first buffer layer 111a and the second buffer layer 111b, and the barrier layer 105 may include the first barrier layer 105a and the second barrier layer 105b.

The first barrier layer 105a may be directly located on a top surface of the first substrate 100, the first buffer layer 111a may be directly located on a top surface of the first barrier layer 105a, the second barrier layer 105b may be directly located on a top surface of the first buffer layer 111a, and the second buffer layer 111b may be directly located on a top surface of the second barrier layer 105b. In an exemplary embodiment of the present disclosure, a metal layer, an inorganic insulating layer, or an organic insulating layer may be additionally located between the first substrate 100 and the first barrier layer 105a, between the first barrier layer 105a and the first buffer layer 111a, between the first buffer layer 111a and the second barrier layer 105b, and between the second barrier layer 105b and the second buffer layer 111b.

The first barrier layer 105a and the second barrier layer 105b according to an exemplary embodiment of the present disclosure may each have high density in a range from about 2 g/cm³ to about 6 g/cm³, such that hydrogen emitted from the first substrate 100 and/or the second substrate 101 may be blocked by the first barrier layer 105a and the second barrier layer 105b having high density. Because the first barrier layer 105a and the second barrier layer 105b are located on the second substrate 101 and the first substrate 100, the first barrier layer 105a and the second barrier layer 105b may prevent hydrogen emitted from the first substrate 100 and the second substrate 101 including transparent polyimide from reaching a semiconductor layer, thereby making it possible to stably perform a laser crystallization process that is a process of crystallizing amorphous silicon into polysilicon.

Figure 15:
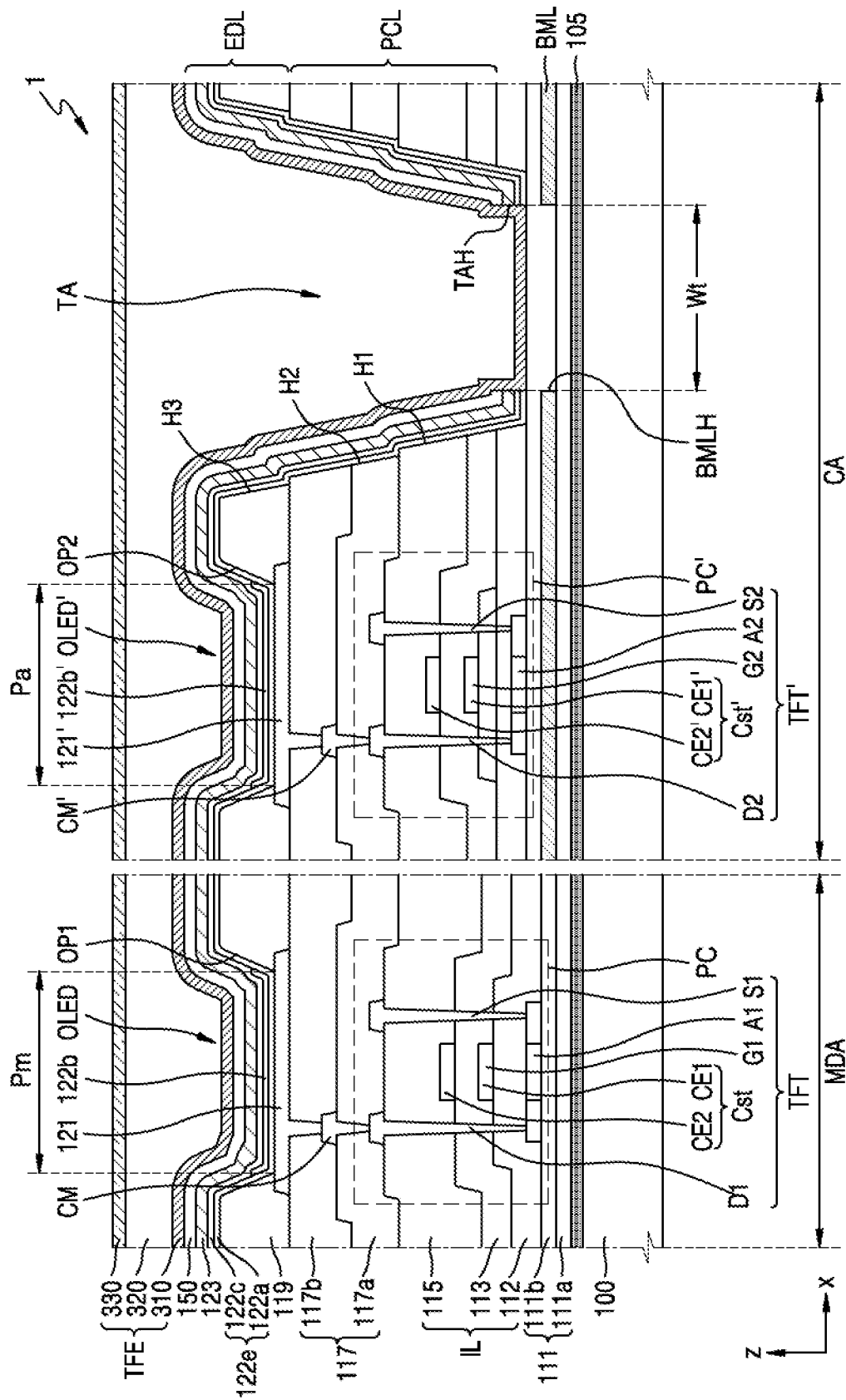
FIG. 15 is a cross-sectional view illustrating a display apparatus according to an exemplary embodiment of the present disclosure.

FIG. 15 is a cross-sectional view illustrating a display apparatus according to an exemplary embodiment of the present disclosure. The exemplary embodiment of FIG. 15 is different from the exemplary embodiment of FIG. 9 in that a buffer layer includes a first buffer layer and a second buffer layer and a bottom metal layer BML is located in the component area CA. The same elements of FIG. 15 as those of FIG. 9 will not be described, and the following will focus on a difference between FIGS. 9 and 15.

Referring to FIG. 15, the barrier layer 105 may be located on the first substrate 100 of the display apparatus 1 according to an exemplary embodiment of the present disclosure. For example, the barrier layer 105 may be directly located on the first substrate 100. In an exemplary embodiment of the present disclosure, a metal layer, an inorganic insulating layer, or an organic insulating layer may be additionally located between the first substrate 100 and the barrier layer 105.

The buffer layer 111 may be located on the barrier layer 105. The buffer layer 111 may include the first buffer layer 111a and the second buffer layer 111b. In an exemplary embodiment of the present disclosure, the first buffer layer 111a may be located on the barrier layer 105, and the second buffer layer 111b may be located on the first buffer layer 111a. In an exemplary embodiment of the present disclosure, a metal layer, an inorganic insulating layer, or an organic insulating layer may be additionally located between the barrier layer 105 and the first buffer layer 111a, and between the first buffer layer 111a and the second buffer layer 111b.

The bottom metal layer BML may be located in the component area CA, and may be located under the auxiliary thin-film transistor TFT' to correspond to the auxiliary thin-film transistor TFT'. For example, the bottom metal layer BML may be located between the auxiliary thin-film transistor TFT' and the first substrate 100. In an exemplary embodiment of the present disclosure, the bottom metal layer BML may be located between the first buffer layer 111a and the second buffer layer 111b, in the component area CA. In an exemplary embodiment of the present disclosure, the bottom metal layer BML may be located over the first buffer layer 111a, and may be located under the second buffer layer 111b.

The bottom metal layer BML may be located under the auxiliary pixel circuit PC', and may prevent degradation of the characteristics of the auxiliary thin-film transistor TFT' due to light emitted from a component or the like. Also, the bottom metal layer BML may prevent light emitted from the component or the like or traveling toward the component from being diffracted through a narrow gap between wirings connected to the auxiliary pixel circuit PC'. The bottom metal layer BML may not exist in the transmission area TA.

The bottom metal layer BML may overlap the second semiconductor layer A2, and may be located in the component area CA. In an exemplary embodiment of the present disclosure, a width of the second semiconductor layer A2 may be less than a width of the bottom metal layer BML, and thus the second semiconductor layer A2 may be entirely overlapped by the bottom metal layer BML in a direction perpendicular to the first substrate 100.

The bottom metal layer BML of the component area CA may be provided to correspond to the entire component area CA. In this case, the bottom metal layer BML may have a bottom hole BMLH overlapping the transmission area TA. For example, the bottom metal layer BML may have the bottom hole BMLH corresponding to the transmission area TA. In an exemplary embodiment of the present disclosure, a shape and a size of the transmission area TA may be defined by a shape and a size of the bottom hole BMLH.

A method of manufacturing a display apparatus including a main display area, a component area including a transmission area, and a peripheral area outside the main display area according to an exemplary embodiment of the present disclosure may include preparing a first substrate, forming a barrier layer having a density ranging from about 2 g/cm$^3$ to about 6 g/cm$^3$ on the first substrate, forming a buffer layer on the barrier layer, and forming a main pixel circuit including a first semiconductor layer on the buffer layer to correspond to the main display area and an auxiliary pixel circuit including a second semiconductor layer on the buffer layer to correspond to the component area.

In an exemplary embodiment of the present disclosure, in the forming of the barrier layer, the barrier layer may include silicon nitride (SiN$_x$) formed by a plasma-enhanced chemical vapor deposition (PECVD) process using at least one gas selected from among ammonia (NH$_3$), nitrogen (N$_2$), and silane (SiH$_4$). In an exemplary embodiment of the present disclosure, in the forming of the barrier layer, the barrier layer may include silicon nitride (Si$_3$N$_4$) formed by a reaction between ammonia (NH$_3$) and silane (SiH$_4$) at a temperature of 1000° C. or higher. In an exemplary embodiment of the present disclosure, the barrier layer may include one material from among, for example, aluminum oxide (Al$_2$O$_3$) and zirconium oxide (Zr$_2$O$_3$) formed by an atomic layer deposition (ALD) process. In an exemplary embodiment of the present disclosure, the silicon nitride (SiN$_x$) included in the barrier layer may be a nitrogen rich silicon nitride (SiN$_x$) with nitrogen to silicon ratio (N/Si) greater than 4/3. That is, x in the formula SiN$_x$ of the nitrogen rich silicon nitride included in the barrier layer is greater than 4/3. The silicon nitride (SiN$_x$) or silicon nitride (Si$_3$N$_4$) included in the barrier layer may have low hydrogen content or no hydrogen content. In an exemplary embodiment of the present disclosure, the barrier layer may include aluminum oxide (Al$_2$O$_3$) or zirconium oxide (Zr$_2$O$_3$), and may have a density ranging from about 2 g/cm$^3$ to about 6 g/cm$^3$.

The barrier layer formed in the forming of the barrier layer may have a thickness ranging from about 200 Å to about 600 Å and may be directly formed on the first substrate. However, various modifications may be made. In an exemplary embodiment of the present disclosure, the barrier layer may have a thickness ranging from about 100 Å to about 600 Å, for example, ranging from 200 Å to 700 Å, or for example, ranging from 300 Å to 500 Å. In an exemplary embodiment of the present disclosure, a metal layer, an inorganic insulating layer, or an organic insulating layer may be additionally located between the first substrate and the barrier layer.

The method of manufacturing the display apparatus according to an exemplary embodiment of the present disclosure may further include, before the preparing of the first substrate, preparing a second substrate, forming a first inorganic layer on the second substrate, and forming a second inorganic layer on the first inorganic layer. The first substrate is formed on the second inorganic layer.

To solve the problem of a conventional display apparatus that when a substrate includes transparent polyimide, it is difficult to perform a laser crystallization process, which is a process of crystallizing amorphous silicon into polysilicon, due to hydrogen emitted from the transparent polyimide, according to an exemplary embodiment of the present disclosure, because a barrier layer including one material from among, for example, silicon nitride (SiN$_x$), silicon nitride (Si$_3$N$_4$), aluminum oxide (Al$_2$O$_3$), and zirconium oxide (Zr$_2$O$_3$) and having a density ranging from about 2 g/cm$^3$ to about 6 g/cm$^3$ is located between the substrate and a semiconductor layer, the barrier layer may prevent hydrogen emitted from the transparent polyimide from reaching the semiconductor layer, thereby making it possible to stably perform a laser crystallization process and enhancing the reliability of a display apparatus.

The exemplary embodiments of the present disclosure may provide a display apparatus in which, because a barrier layer is located on a substrate including transparent polyimide, a laser crystallization process that is a process of crystallizing amorphous silicon into polysilicon is stably performed and the reliability of a product is enhanced and a method of manufacturing the display apparatus. However, the scope of the present disclosure is not limited by the effects.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments. While specific exemplary embodiments have been described with reference to the figures, it will be understood by those of ordinary skill in the art that various changes in form and details may be made therein without departing from the spirit and scope of the present disclosure as defined by the appended claims.

What is claimed is:

1. A display apparatus comprising a main display area, a component area comprising a transmission area, and a peripheral area located outside the main display area, the display apparatus further comprising:

a first substrate comprising transparent polyimide;
a main display element located on the first substrate to correspond to the main display area;
a main pixel circuit located on the first substrate to correspond to the main display area, comprising a first semiconductor layer connected to the main display element;
an auxiliary display element located on the first substrate to correspond to the component area;
an auxiliary pixel circuit located on the first substrate to correspond to the component area, comprising a second semiconductor layer connected to the auxiliary display element;
a buffer layer located between the first substrate and the first semiconductor layer and between the first substrate and the second semiconductor layer;
a barrier layer located between the first substrate and the buffer layer, comprising one material from among a nitrogen rich silicon nitride ($SiN_x$) having low or no hydrogen content with x being greater than 4/3 and zirconium oxide ($Zr_2O_3$), and having a density ranging from about 2 g/cm$^3$ to about 6 g/cm$^3$;
a second substrate located under the first substrate and the second substrate comprising transparent polyimide;
a first inorganic layer located between the first substrate and the second substrate; and
a second inorganic layer directly located on the first inorganic layer.

2. The display apparatus of claim 1, wherein the barrier layer is directly located on the first substrate.

3. The display apparatus of claim 2, wherein the barrier layer has a thickness ranging from about 200 Å to about 600 Å from a top surface of the first substrate.

4. The display apparatus of claim 1, wherein the auxiliary display element comprises a counter electrode, and
the counter electrode has a transmission hole corresponding to the transmission area.

5. The display apparatus of claim 1, wherein the buffer layer comprises a first buffer layer and a second buffer layer, and
the barrier layer is located between the first buffer layer and the second buffer layer.

6. The display apparatus of claim 5, wherein the barrier layer has a thickness ranging from about 200 Å to about 600 Å from a top surface of the first buffer layer.

7. The display apparatus of claim 1, wherein the barrier layer comprises a first barrier layer and a second barrier layer, and
the buffer layer comprises a first buffer layer and a second buffer layer.

8. The display apparatus of claim 7, wherein the first barrier layer is directly located on the first substrate,
the first buffer layer is directly located on the first barrier layer,
the second barrier layer is directly located on the first buffer layer, and
the second buffer layer is directly located on the second barrier layer.

9. The display apparatus of claim 1, wherein a thickness of the second substrate is greater than a thickness of the first substrate.

10. The display apparatus of claim 1, wherein the barrier layer has a thickness ranging from about 200 Å to about 600 Å, and is directly located on the first substrate.

11. The display apparatus of claim 1, wherein the buffer layer comprises a first buffer layer and a second buffer layer, and
the barrier layer is located between the first buffer layer and the second buffer layer.

12. The display apparatus of claim 1, wherein the barrier layer comprises a first barrier layer and a second barrier layer,
the buffer layer comprises a first buffer layer and a second buffer layer,
the first barrier layer is directly located on the first substrate,
the first buffer layer is directly located on the first barrier layer,
the second barrier layer is directly located on the first buffer layer, and
the second buffer layer is directly located on the second barrier layer.

13. The display apparatus of claim 1, further comprising a bottom metal layer located between the first substrate and the auxiliary pixel circuit in the component area,
wherein the bottom metal layer has a bottom hole corresponding to the transmission area.

14. A method of manufacturing a display apparatus comprising a main display area, a component area comprising a transmission area, and a peripheral area located outside the main display area, the method comprising:
preparing a second substrate;
forming a first inorganic layer on the second substrate;
forming a second inorganic layer on the first inorganic layer;
forming a first substrate on the second inorganic layer and the first substrate comprising transparent polyimide;
forming a barrier layer having a density ranging from about 2 g/cm$^3$ to about 6 g/cm$^3$ on the first substrate;
forming a buffer layer on the barrier layer; and
forming a main pixel circuit comprising a first semiconductor layer located on the buffer layer to correspond to the main display area and an auxiliary pixel circuit comprising a second semiconductor layer located on the buffer layer to correspond to the component area,
wherein the barrier layer comprises one material from among a nitrogen rich silicon nitride ($SiN_x$) having low or no hydrogen content with x being greater than 4/3, a silicon nitride ($Si_3N_4$) having low or no hydrogen content, and zirconium oxide ($Zr_2O_3$).

15. The method of claim 14, wherein, in the forming of the barrier layer having the density ranging from about 2 g/cm$^3$ to about 6 g/cm$^3$ on the first substrate, the barrier layer comprises the nitrogen rich silicon nitride ($SiN_x$) having low or no hydrogen content with x being greater than 4/3 formed by a plasma-enhanced chemical vapor deposition (PECVD) process using at least one gas selected from among ammonia ($NH_3$), nitrogen ($N_2$), and silane ($SiH_4$).

16. The method of claim 14, wherein, in the forming of the barrier layer having the density ranging from about 2 g/cm$^3$ to about 6 g/cm$^3$ on the first substrate, the barrier layer comprises the silicon nitride ($Si_3N_4$) having low or no hydrogen content formed by a reaction between ammonia ($NH_3$) and silane ($SiH_4$) at a temperature of 1000° C. or higher.

17. The method of claim 14, wherein, in the forming of the barrier layer having the density ranging from about 2 g/cm$^3$ to about 6 g/cm$^3$ on the first substrate, the barrier layer comprises zirconium oxide ($Zr_2O_3$) formed by an atomic layer deposition (ALD) process.

18. The method of claim 14, wherein the barrier layer has a thickness ranging from about 200 Å to about 600 Å, and is directly formed on the first substrate.

19. A display apparatus comprising:
a first substrate formed of transparent polyimide, the first substrate comprising a main display area, a component area comprising a transmission area and at least partially surrounded by the main display area, and a peripheral area located outside the main display area;
a barrier layer having a density ranging from about 2 g/cm$^3$ to about 6 g/cm$^3$ directly formed on the first substrate;
a buffer layer formed on the barrier layer;
a main pixel circuit comprising a first semiconductor layer formed on the buffer layer to correspond to the main display area;
an auxiliary pixel circuit comprising a second semiconductor layer formed on the buffer layer to correspond to the component area;
a second substrate located under the first substrate and the second substrate comprising transparent polyimide;
a first inorganic layer located between the first substrate and the second substrate; and
a second inorganic layer directly located on the first inorganic layer,
wherein the barrier layer has a thickness ranging from about 200 Å to about 600 Å from a top surface of the first substrate, and comprises one material from among a nitrogen rich silicon nitride ($SiN_x$) having low or no hydrogen content with x being greater than 4/3, a silicon nitride ($Si_3N_4$) having low or no hydrogen content, and zirconium oxide ($Zr_2O_3$).

\* \* \* \* \*